(12) United States Patent
Lee et al.

(10) Patent No.: US 12,356,823 B2
(45) Date of Patent: *Jul. 8, 2025

(54) DISPLAY DEVICE THAT CAN PREVENT DETERIORATION OF TRANSMITTANCE WHILE PREVENTING CONTRAST DETERIORATION

(71) Applicant: Samsung Display Co., Ltd., Yongin-Si (KR)

(72) Inventors: Jae Hun Lee, Seongnam-si (KR); Jun Gi Kim, Hwaseong-si (KR); Jun Ho Sim, Hwaseong-si (KR); Yang-Ho Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/516,949

(22) Filed: Nov. 22, 2023

(65) Prior Publication Data

US 2024/0099056 A1 Mar. 21, 2024

Related U.S. Application Data

(63) Continuation of application No. 17/326,232, filed on May 20, 2021, now Pat. No. 11,864,416.

(30) Foreign Application Priority Data

Sep. 11, 2020 (KR) ........................ 10-2020-0117035

(51) Int. Cl.
*H10K 59/35* (2023.01)
*H10K 50/86* (2023.01)
(Continued)

(52) U.S. Cl.
CPC ........... *H10K 59/352* (2023.02); *H10K 50/86* (2023.02); *H10K 50/865* (2023.02); *H10K 59/12* (2023.02);
(Continued)

(58) Field of Classification Search
CPC .. H10K 50/865; H10K 59/122; H10K 59/131; H10K 59/126
See application file for complete search history.

(56) References Cited

U.S. PATENT DOCUMENTS 7,679,283 B2 * 3/2010 Nimura ................ H10K 59/128
313/506
11,864,416 B2 * 1/2024 Lee ...................... H10K 59/352
(Continued)

FOREIGN PATENT DOCUMENTS

JP 2015-050011 A 3/2015
KR 10-2016-0128547 A 11/2016
(Continued)

*Primary Examiner* — Nduka E Ojeh
(74) *Attorney, Agent, or Firm* — Innovation Counsel LLP

(57) ABSTRACT

A display device includes: a substrate; a plurality of transistors disposed on the substrate; an insulating layer disposed on the plurality of transistors; a data line and a driving voltage line disposed on the insulating layer; a pixel electrode disposed on the data line or the driving voltage line; a pixel defining layer disposed on the pixel electrode and including a pixel opening that overlaps the pixel electrode; a light emitting element layer disposed in the pixel opening; and a common electrode disposed on the light emitting element layer, wherein the pixel opening includes a first sub-pixel opening and a second sub-pixel opening and a first blocking portion that is disposed between the first sub-pixel opening and the second sub-pixel opening.

20 Claims, 20 Drawing Sheets

(51) Int. Cl.
*H10K 59/12* (2023.01)
*H10K 59/122* (2023.01)
*H10K 59/131* (2023.01)
*H10K 59/38* (2023.01)
*H10K 59/40* (2023.01)
*H10K 59/80* (2023.01)

(52) U.S. Cl.
CPC ......... *H10K 59/122* (2023.02); *H10K 59/131* (2023.02); *H10K 59/38* (2023.02); *H10K 59/40* (2023.02); *H10K 59/8792* (2023.02)

(56) References Cited

U.S. PATENT DOCUMENTS

| | | | |
|---|---|---|---|
| 2014/0367664 A1* | 12/2014 | Park | H10K 59/121 |
| | | | 438/34 |
| 2016/0211487 A1 | 7/2016 | Choi et al. | |
| 2018/0076270 A1* | 3/2018 | Kwon | H10K 59/353 |
| 2018/0331326 A1 | 11/2018 | Woo et al. | |
| 2019/0245017 A1* | 8/2019 | Jeon | H10K 59/126 |
| 2022/0181391 A1* | 6/2022 | Park | H10K 59/38 |

FOREIGN PATENT DOCUMENTS

| | | |
|---|---|---|
| KR | 10-2018-0025431 A | 3/2018 |
| KR | 10-2018-0035987 A | 4/2018 |
| KR | 10-2018-0125674 A | 11/2018 |
| KR | 10-2019-0096472 A | 8/2019 |
| KR | 10-2038817 B1 | 11/2019 |
| KR | 10-2020-0006647 A | 1/2020 |
| KR | 10-2020-0119946 A | 10/2020 |

\* cited by examiner

DISPLAY DEVICE THAT CAN PREVENT DETERIORATION OF TRANSMITTANCE WHILE PREVENTING CONTRAST DETERIORATION

CROSS-REFERENCE TO RELATED APPLICATION

This application is a continuation application of U.S. patent application Ser. No. 17/326,232 filed on May 20, 2021, which claims priority to and the benefit of Korean Patent Application No. 10-2020-0117035 filed in the Korean Intellectual Property Office on Sep. 11, 2020, the disclosure of which is incorporated herein by reference in its entirety.

BACKGROUND

1. Field

The present disclosure relates to a display device.

2. Description of the Related Art

Among various types of display devices, a liquid crystal display (LCD) device, a plasma display panel (PDP) display device, an organic light emitting diode (OLED) display device, a field effect display (FED) device, and an electrophoretic display device are well known and widely used.

Compared to the LCD device that requires a separate light source, the OLED display device has a reduced thickness and a light weight due to a self-luminance characteristic. Further, the OLED display device has high-grade characteristics such as low power consumption and high luminance.

However, external light incident on the OLED display device may be reflected from the surface, so that the contrast of the OLED display device may be reduced. Thus, the OLED display device may be equipped with an anti-reflection portion to prevent deterioration of the contrast due to external light, thereby improving visibility. To prevent transmittance deterioration due to the anti-reflection portion, a light blocking layer and a color filter that overlap a light emitting portion and transmit light of a wavelength that is similar to a wavelength of light emitted from an emission layer of the light emitting portion may be formed in a non-light emitting portion. In a case where a color filter is formed in the anti-reflection portion, the color and contrast may be deteriorated because external light is reflected and viewed due to a step that may be formed by a wire disposed below the emission layer of a display area.

The above information disclosed in this Background section is only for enhancement of understanding of the background of the present disclosure, and therefore it may contain information that does not form a prior art that is already known to a person of ordinary skill in the art.

SUMMARY

The present disclosure provides a display device that can prevent deterioration of transmittance while preventing contrast deterioration, and prevent visual recognition of external light due to reflection of the external light.

It is apparent that the present disclosure is not limited to the embodiments disclosed herein, and can be variously extended without deviating from the spirit and region of the present disclosure.

A display device according to an embodiment includes: a substrate; a plurality of transistors disposed on the substrate; an insulating layer disposed on the plurality of transistors; a data line and a driving voltage line disposed on the insulating layer; a pixel electrode disposed on the data line or the driving voltage line; a pixel defining layer disposed on the pixel electrode, and including a pixel opening that overlaps the pixel electrode; a light emitting element layer disposed in the pixel opening; and a common electrode disposed on the light emitting element layer, wherein the pixel opening includes a first sub-pixel opening and a second sub-pixel opening and a first blocking portion that is disposed between the first sub-pixel opening and the second sub-pixel opening.

The first blocking portion may overlap at least one of the data line and the driving voltage line.

The driving voltage line may include two adjacent expansion portions and an opening that is disposed between the two expansion portions, and the first blocking portion overlaps the opening of the driving voltage line.

The data line may include two adjacent data lines that overlap the pixel electrode, and the first blocking portion overlaps the two adjacent data lines.

The first blocking portion may include a second blocking portion and a third blocking portion that respectively overlap the two adjacent data lines.

The second blocking portion may include a first sub-blocking portion and a second sub-blocking portion that overlap a first edge of a first data line of the two adjacent data lines, and the third blocking portion may include a third sub-blocking portion and a fourth sub-blocking portion that overlap a second edge of a second data line of the two adjacent data lines.

The two adjacent data lines may be separated by a separation portion, and the first blocking portion may overlap the separation portion and the two adjacent data lines.

The display device may further include an anti-reflection portion disposed on the substrate, wherein the anti-reflection portion may include a light blocking layer that overlaps the pixel defining layer and a color filter layer that overlaps the light emitting element layer.

The first blocking portion may overlap the color filter layer.

The display device may further include a touch portion disposed between the light emitting element layer and the anti-reflection portion.

A display device according to an embodiment includes: a data line and a driving voltage line disposed on a substrate; a pixel electrode disposed on the substrate and including a first pixel electrode, a second pixel electrode, and a third pixel electrode; a pixel defining layer disposed on the substrate and including a first pixel opening that overlaps the first pixel electrode, a second pixel opening that overlaps the second pixel electrode, and a third pixel opening that overlaps the third pixel electrode; a light emitting element layer including a first light emitting element layer that is disposed in the first pixel opening and displays a first color, a second light emitting element layer that is disposed in the second pixel opening and displays a second color, and a third light emitting element layer that is disposed in the third pixel opening and displays a third color; and a common electrode disposed on the light emitting element layer, wherein the first pixel opening includes a first sub-pixel opening and a second sub-pixel opening, the pixel defining layer further includes a blocking portion that overlaps the first pixel electrode, the blocking portion is disposed between the first sub-pixel opening and the second sub-pixel opening, and the blocking portion overlaps a step portion of the first pixel electrode.

The blocking portion may overlap the driving voltage line.

The driving voltage line may include two adjacent expansion portions and an opening that is disposed between the two expansion portions, and the blocking portion may overlap the opening of the driving voltage line.

The display device may further include an anti-reflection portion disposed on the substrate, wherein the anti-reflection portion may include a light blocking portion that overlaps the pixel defining layer, and a color filter layer that overlaps the light emitting element layer, and the light blocking portion of the anti-reflection portion may overlap the color filter layer.

The second pixel opening may include a third sub-pixel opening, a fourth sub-pixel opening, and a fifth sub-pixel opening, the pixel defining layer may further include a first blocking portion and a second blocking portion that overlap the second pixel electrode, the first blocking portion may be disposed between the third sub-pixel opening and the fifth sub-pixel opening, the second blocking portion may be disposed between the fourth sub-pixel opening and the fifth sub-pixel opening, and at least one of the first blocking portion and the second blocking portion may overlap a step portion of the second pixel electrode.

The data line may include two adjacent data lines that overlap the pixel electrode, and the first blocking portion and the second blocking portion may respectively overlap the two adjacent data lines.

The first blocking portion may include a first sub-blocking portion and a second sub-blocking portion that overlap a first of a first data line of the two adjacent data lines, and a third sub-blocking portion and a fourth sub-blocking portion that overlap a second edge of a second data line of the two adjacent data lines.

The display device may further include an anti-reflection portion disposed on the substrate, the anti-reflection portion may include a light blocking portion that overlaps the pixel defining layer, a first color filter layer that overlaps the first light emitting element layer, a second color filter layer that overlaps the second light emitting element layer, and a third color filter layer that overlaps the third light emitting element layer, the light blocking portion of the anti-reflection portion may overlap the first color filter, and at least one of the first blocking portion and the second blocking portion may overlap the second color filter layer.

The data line may include two adjacent data lines that overlap the second pixel electrode, and the blocking portion may overlap the two adjacent data lines.

The two adjacent data lines may be separated by a separation portion, and the blocking portion may overlap the separation portion and the two adjacent data lines.

The display device according to the embodiments of the present disclosure can prevent deterioration of transmittance while preventing contrast deterioration by including an anti-reflection portion that includes a color filter, and prevent visual recognition of reflected light of the external light due to a step formed below an emission layer.

It is apparent that the features of the present disclosure is not limited to the above-described features, and can be variously extended without deviating from the spirit and scope of the present disclosure.

DETAILED DESCRIPTION

Figure 1:
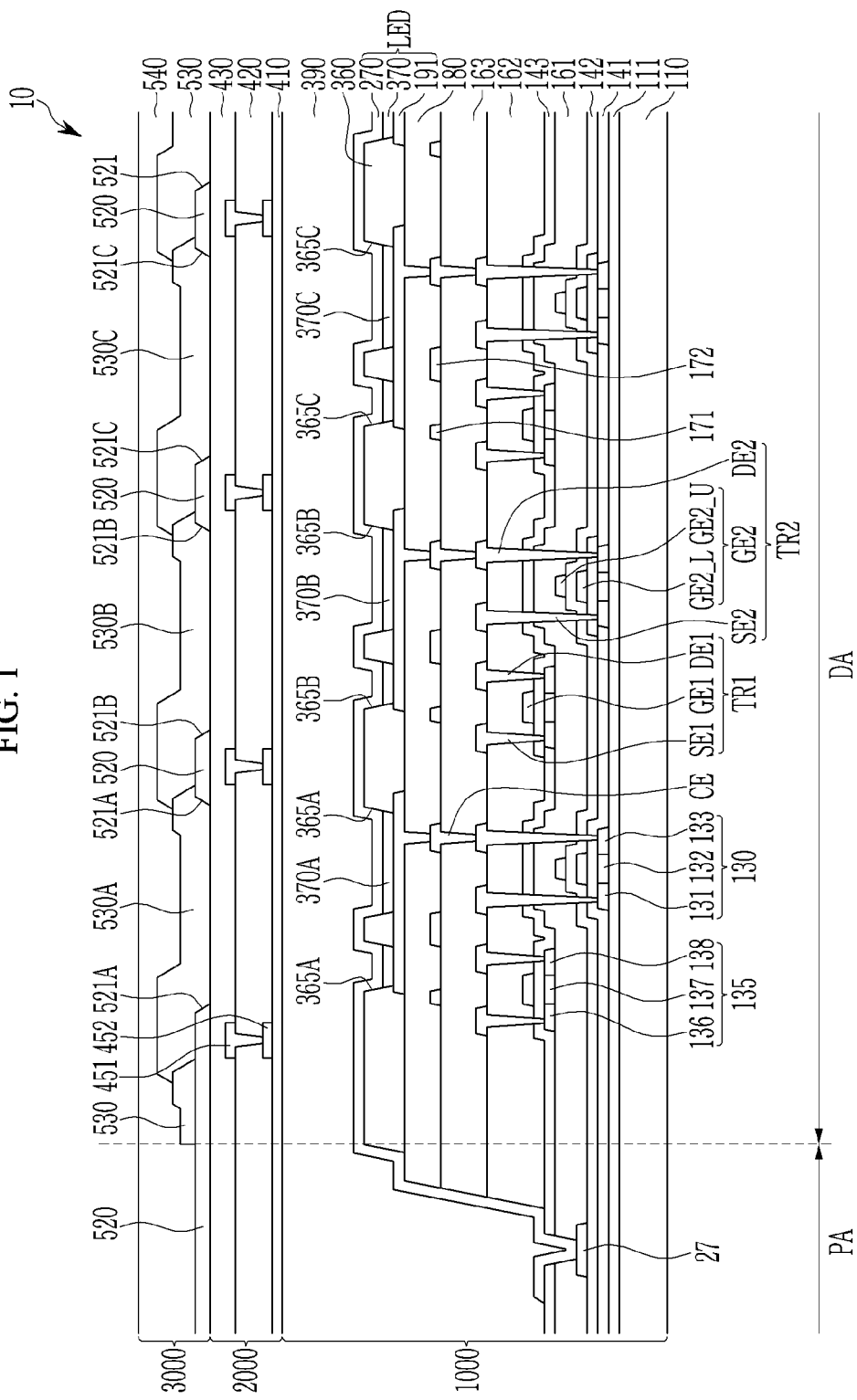
FIG. 1 is a cross-sectional view of a display device according to an embodiment.

The present disclosure will be described more fully hereinafter with reference to the accompanying drawings, in which embodiments of the present disclosure are shown. As those skilled in the art would realize, the described embodiments may be modified in various different ways, without departing from the spirit or scope of the present disclosure.

The drawings and description are to be regarded as illustrative in nature and not restrictive. Like reference numerals designate like elements throughout the present disclosure.

In the drawings, size and thickness of elements may be arbitrarily illustrated for convenience of description, and the present disclosure is not necessarily limited to those illustrated in the drawings. In the drawings, the thickness of layers, films, panels, regions, etc., may be exaggerated for clarity. In addition, in the drawings, for better understanding and ease of description, the thicknesses of some layers and regions may be exaggerated more than other layers and regions.

It will be understood that when an element such as a layer, film, region, or substrate is referred to as being "on" another element, it can be directly on the other element or one or more intervening elements may also be present therebetween. In contrast, when an element is referred to as being "directly on" another element, there may be no intervening elements present. Further, throughout the present disclosure, the word "on" a target element will be understood to be disposed above or below the target element, and will not necessarily be understood to be disposed "at an upper side" based on a gravitational (or thickness) direction.

In addition, unless explicitly described to the contrary, the word "comprise" and its variations such as "comprises" or "comprising" will be understood to imply an inclusion of stated elements but not an exclusion of any other elements.

Further, throughout the present disclosure, the phrase "on a plane" means viewing a target portion from the top, and the phrase "on a cross-section" means viewing a cross-section formed by vertically cutting a target portion from a side.

Throughout the present disclosure, "connected" is not limited to mean only when two or more constituent elements are directly connected, but also when two or more constituent elements are indirectly connected through another constituent element. In addition, physically connected or electrically connected may include a case in which substantially integral parts are connected to each other although they may be referred to by different names according to positions or functions.

FIG. 1 is a cross-sectional view of a display device according to an embodiment.

Referring to FIG. 1, a display device 10 includes a display portion 1000, a touch portion 2000, and an anti-reflection portion 3000. The touch portion 2000 may be disposed between the display portion 1000 and the anti-reflection portion 3000. The display device 10 includes a display area DA and a peripheral area PA.

The display portion 1000 includes a substrate 110, and a buffer layer 111 is disposed on the substrate 110.

The substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may be a rigid substrate, or a flexible substrate that is bendable, foldable, or rollable. The substrate 110 may be single-layered or multi-layered. The substrate 110 may be alternately stacked with at least one base layer and at least one inorganic layer including a sequentially stacked polymer resin.

The buffer layer 111 disposed between the substrate 110 and the second semiconductor 130 may improve a characteristic of polycrystalline silicon by preventing permeation of impurities through the substrate 110 during a crystallization process for forming the polycrystalline silicon, and may planarize the substrate 110 to release stress of the second semiconductor 130 that is formed on the buffer layer 111.

The buffer layer 111 may include an inorganic insulating material such as a silicon oxide ($SiO_x$), a silicon nitride ($SiN_x$), a silicon oxynitride ($SiO_xN_y$), and the like. The buffer layer 111 may include amorphous silicon (Si).

Although it is not illustrated, a barrier layer may be further provided between the substrate 110 and the buffer layer 111. The barrier layer may have a single-layered structure or multi-layered structure. The barrier layer may include an inorganic insulating material such as a silicon oxide, a silicon nitride, a silicon oxynitride, and the like.

The second semiconductor 130 may be disposed on the buffer layer 111. The second semiconductor 130 may include a polycrystalline silicon material. That is, the second semiconductor 130 may be formed of a polycrystalline semiconductor. The second semiconductor 130 may include a source region 131, a channel region 132, and a drain region 133.

The source region 131 of the second semiconductor 130 may be connected with a second source electrode SE2, and the drain region 133 of the second semiconductor 130 may be connected with a second drain electrode DE2.

A first gate insulating layer 141 may be disposed on the second semiconductor 130. The first gate insulating layer 141 may have a single-layered or multi-layered structure including a silicon nitride, a silicon oxide, a silicon oxynitride, or the like.

A second gate lower electrode GE2_L may be disposed on the first gate insulating layer 141. The second gate lower electrode GE2_L may include molybdenum (Mo), aluminum (Al), copper (Cu), and/or titanium (Ti), and may have a single-layered structure or multi-layered structure including molybdenum (Mo), aluminum (Al), copper (Cu), and/or titanium (Ti).

A second gate insulating layer 142 may be disposed on the second gate lower electrode GE2_L. The second gate insulating layer 142 may include a silicon nitride, a silicon oxide, a silicon oxynitride, or the like. The second gate insulating layer 142 may have a single layered or multi-layered structure including a silicon nitride, a silicon oxide, a silicon oxynitride, or the like.

A second gate upper electrode GE2_U may be disposed on the second gate insulating layer 142. The second gate lower electrode GE2_L and the second gate upper electrode GE2_U may overlap each other with the second gate insulating layer 142 disposed therebetween. The second gate upper electrode GE2_U and the second gate lower electrode GE2_L form a second gate electrode GE2. The second gate electrode GE2 may overlap the channel region 132 of the second semiconductor 130 in a thickness direction that is perpendicular to the substrate 110.

The second gate upper electrode GE2_U and a gate line GL may include molybdenum (Mo), aluminum (Al), copper (Cu), silver (Ag), chromium (Cr), tantalum (Ta), titanium (Ti), or the like, and may have a single-layered structure or multi-layered structure including molybdenum (Mo), aluminum (Al), copper (Cu), silver (Ag), chromium (Cr), tantalum (Ta), titanium (Ti), or the like.

Although it is not illustrated, a metal blocking layer BML that is formed on the same layer as the second gate upper electrode GE2_U and the gate line GL may be disposed on the second gate insulating layer 142. The metal blocking layer BML may overlap a first transistor TR1, which will be described later.

The second semiconductor 130, the second gate electrode GE2, the second source electrode SE2, and the second drain electrode DE2 form a second transistor TR2. The second transistor TR2 may be a driving transistor that is connected with a light emitting diode LED, and may include a polycrystalline semiconductor.

A first interlayer insulating layer 161 may be disposed on the second gate electrode GE2. The first interlayer insulating layer 161 may include a silicon nitride, a silicon oxide, a silicon oxynitride, or the like. The first interlayer insulating layer 161 may be formed of a multilayer in which a layer containing a silicon nitride and a layer containing a silicon oxide are stacked. In this case, the layer of the first interlayer insulating layer 161 that includes a silicon nitride may be disposed closer to the substrate 110 than the layer including a silicon oxide.

A first semiconductor 135 may be disposed on the first interlayer insulating layer 161. The first semiconductor 135 may overlap the metal blocking layer BML that may be disposed on the second gate insulating layer 142.

The first semiconductor 135 may include an oxide semiconductor. The oxide semiconductor may include at least one of indium oxide (InO), tin oxide (SnO), zinc oxide (ZnO), hafnium oxide (HfO), and aluminum oxide (AlO). For example, the first semiconductor 135 may include indium-gallium-zinc oxide (IGZO).

The first semiconductor 135 may include a channel region 137, and a source region 136, and a drain region 138. The source region 136 and the drain region 138 are disposed at opposite sides of the channel region 137. The source region 136 of the first semiconductor 135 may be connected with a first source electrode SE1, and the drain region 138 of the first semiconductor 135 may be connected with a first drain electrode DE1.

A third gate insulating layer 143 may be disposed on the first semiconductor 135. The third gate insulating layer 143 may include a silicon nitride, a silicon oxide, a silicon oxynitride, or the like.

In the present embodiment, the third gate insulating layer 143 may be entirely disposed on the first semiconductor 135 and the first interlayer insulating layer 161. Thus, the third gate insulating layer 143 covers top surfaces and side surfaces of the source region 136, the channel region 137, and the drain region 138 of the first semiconductor 135.

In a high-resolution display device, a size of each pixel may decrease, and accordingly, a length of the channel region may decrease. In this case, if the third gate insulating layer 143 does not cover the top surfaces of the source region 136 and the drain region 138, some materials of the first semiconductor 135 may move to the side of the third gate insulating layer 143. In the present embodiment, the third gate insulating layer 143 is entirely disposed on the first semiconductor 135 and the first interlayer insulating layer 161, and thus a short circuit between the first semiconductor 135 and a first gate electrode GE1 that may be caused by diffusion of metal particles can be prevented.

However, the present disclosure is not limited thereto, and the third gate insulating layer 143 may not be entirely disposed on the first semiconductor 135 and/or the first interlayer insulating layer 161. For example, the third gate insulating layer 143 may be disposed only between the first gate electrode GE1 and the first semiconductor 135. In this case, the third gate insulating layer 143 may overlap the channel region 137 of the first semiconductor 135, but may not overlap the source region 136 and the drain region 138 of the first semiconductor 135.

The first gate electrode GE1 may be disposed on the third gate insulating layer 143.

The first gate electrode GE1 may overlap the channel region 137 of the first semiconductor 135 in the thickness direction perpendicular to the substrate 110. The first gate electrode GE1 may include molybdenum (Mo), aluminum (Al), copper (Cu), and/or titanium (Ti), and may have a single-layered or multi-layered structure including molybdenum (Mo), aluminum (Al), copper (Cu), and/or titanium (Ti). For example, the first gate electrode GE1 may include a lower layer containing titanium and an upper layer containing molybdenum. In this case, the lower layer containing titanium may prevent the diffusion of fluorine (F) that may be used as an etching gas during dry etching of the upper layer.

The first semiconductor 135, the first gate electrode GE1, the first source electrode SE1, and the first drain electrode DE1 form the first transistor TR1. The first transistor TR1 may be a switching transistor for switching the second transistor TR2, and may include an oxide semiconductor.

A second interlayer insulating layer 162 may be disposed on the first gate electrode GE1. The second interlayer insulating layer 162 may include a silicon nitride, a silicon oxide, a silicon oxynitride, or the like. The second interlayer insulating layer 162 may be formed of a multilayer in which a layer containing a silicon nitride and a layer containing a silicon oxide are stacked.

The first source electrode SE1, the first drain electrode DE1, the second source electrode SE2, and the second drain electrode DE2 may be disposed on the second interlayer insulating layer 162. The first source electrode SE1, the first drain electrode DE1, the second source electrode SE2, and the second drain electrode DE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu) and may have a single-layered or multi-layered structure including two or more of the above-listed materials. For example, the first source electrode SE1, the first drain electrode DE1, the second source electrode SE2, and the second drain electrode DE2 may have a triple-layered structure including a lower layer containing a refractory metal such as titanium, molybdenum, chromium, tantalum, or an alloy thereof, an interlayer containing an aluminum-based metal with low resistivity, a silver-based metal, or a copper-based metal, and an upper layer containing a refractory metal such as titanium, molybdenum, chromium, and tantalum.

The first source electrode SE1 may be connected with the source region 136 of the first semiconductor 135, and the first drain electrode DE1 may be connected with the drain region 138 of the first semiconductor 135.

The second source electrode SE2 may be connected with the source region 131 of the second semiconductor 130, and the second drain electrode DE2 may be connected with the drain region 133 of the second semiconductor 130.

A third interlayer insulating layer 163 may be disposed on the first source electrode SE1, the first drain electrode DE1, the second source electrode SE2, and the second drain electrode DE2. The third interlayer insulating layer 163 may be an organic layer or an inorganic layer. For example, the third interlayer insulating layer 163 may include an organic insulating material such as a general-purpose polymer including, but not limited to, polymethyl methacrylate (PMMA) or polystyrene (PS), a polymer derivative having a phenolic group, an acryl-based polymer, an imide polymer, polyimide, an acryl-based polymer, a siloxane-based polymer, and the like.

A connection electrode CE, a data line 171, and a driving voltage line 172 may be disposed on the third interlayer insulating layer 163. The connection electrode CE and the data line 171 may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layer structured including two or more of the above-listed materials.

The connection electrode CE is connected with the second drain electrode DE2.

A passivation layer 180 may be disposed on the third interlayer insulating layer 163, the connection electrode CE, and the data line 171. The passivation layer 180 may serve to planarize a surface by removing a step to improve light emission efficiency of a light emitting element that is formed thereon. The passivation layer 180 may include an organic insulating material such as a general-purpose polymer including, but not limited to, polymethyl methacrylate (PMMA) or polystyrene (PS), a polymer derivative having a phenolic group, an acryl-based polymer, an imide polymer, polyimide, an acryl-based polymer, a siloxane-based polymer, and the like.

A pixel electrode 191 may be disposed on the passivation layer 180. The pixel electrode 191 may be connected with the second drain electrode DE2 through a contact hole of the passivation layer 180.

The pixel electrode 191 may be provided individually for each pixel PX. The pixel electrode 191 may include a metal such as silver (Ag), lithium (Li), calcium (Ca), aluminum (Al), magnesium (Mg), and gold (Au), or may include a transparent conductive oxide such as indium tin oxide (ITO) and indium zinc oxide (IZO). The pixel electrode 191 may be formed of a single layer including a metal material or a transparent conductive oxide, or a multiple layer including two or more of the above-listed materials. For example, the pixel electrode 191 may have a triple layer structure of indium tin oxide (ITO)/silver (Ag)/indium tin oxide (ITO).

A pixel defining layer 360 may be disposed on the pixel electrode 191. The pixel defining layer 360 may include an organic insulating material such as a general-purpose polymer including, but not limited to, polymethyl methacrylate (PMMA) or polystyrene (PS), a polymer derivative having a phenolic group, an acryl-based polymer, an imide polymer, polyimide, an acryl-based polymer, a siloxane-based polymer, or the like. The pixel defining layer 360 includes a black dye and may not transmit light.

Pixel openings 365A, 365B, and 365C are formed in the pixel defining layer 360, and the pixel openings 365A, 365B, and 365C of the pixel defining layer 360 may overlap the pixel electrode 191. The pixel openings 365A, 365B, and 365C may be collectively referred to as pixel openings 365, or individually referred to as a pixel opening 365. Light emitting element layers 370A, 370B, and 370C may be disposed in the pixel openings 365A, 365B, and 365C of the pixel defining layer 360. The light emitting element layers 370A, 370B, and 370C may be collectively referred to as light emitting element layers 370, or individually referred to as a light emitting element layer 370.

The light emitting element layers 370A, 370B, and 370C may include layers that uniquely emit light of primary colors of red, green, and blue. Each of the light emitting element layers 370A, 370B, and 370C may have a structure in which a plurality of layers emitting lights of different colors are stacked.

A common electrode 270 may be disposed on the light emitting element layers 370A, 370B, and 370C and the pixel defining layer 360. The common electrode 270 may commonly correspond to a plurality of pixels PX, and may receive a common voltage ELVSS through a common voltage transmission portion 27 in the peripheral area PA.

The common electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), or the like, or a transparent conductive oxide (TCO) such as indium tin oxide (ITO) and indium zinc oxide (IZO).

The pixel electrode 191, the light emitting element layers 370A, 370B, and 370C and the common electrode 270 form the light emitting diode LED. Here, the pixel electrode 191 may correspond to an anode or a hole injection electrode, and the common electrode 270 may correspond to a cathode or an electron injection electrode. However, the present disclosure is not limited thereto, and depending on a type and/or a driving scheme of an organic light emitting display (OLED) device, the pixel electrode 191 may correspond to a cathode and the common electrode 270 may correspond to an anode.

The holes and the electrons are injected into the light emitting element layers 370 from the pixel electrode 191 and the common electrode 270, respectively, and an excitons generated by coupling the injected holes and electrons fall down from an excited state to a ground state to emit light.

The first transistor TR1 that is a part of the switching transistor of the display device 10 may include an oxide semiconductor, and the second transistor TR2 that is a driving transistor may include a polycrystalline semiconductor. For high-speed driving, a motion picture can be expressed more naturally by increasing a driving frequency of the display device (e.g., about 60 Hz to about 120 Hz), but this increases power consumption. To compensate for the increased power consumption, the driving frequency of the display device 10 may be lowered when displaying a still image. For example, when displaying a still image, the display device 10 may be driven at about 1 Hz. When the driving frequency is lowered as described above, a leakage current may occur. In the display device 10, the first transistor TR1 that is or is a part of a switching transistor includes an oxide semiconductor, thereby minimizing a leakage current. In addition, the second transistor TR2 that is a driving transistor includes a polycrystalline semiconductor, thereby providing high electron mobility. That is, the switching transistor and the driving transistor include different semiconductor materials, and thus the display device 10 may be driven more stably with high reliability.

An encapsulation layer 390 is disposed on the common electrode 270. The encapsulation layer 390 may seal the display portion 1000 by covering not only an upper surface of the display portion 1000 but also side surfaces of the display portion 1000. The encapsulation layer 390 may be disposed in the entire display area DA, and may extend from the display area DA to the peripheral area PA such that an end of the encapsulation layer 390 may be located in the peripheral area PA.

Since an organic light emitting element included in the light emitting element layers 370 is very weak to moisture and oxygen, the encapsulation layer 390 encapsulates the display portion 1000 to prevent permeation of external moisture and oxygen into the light emitting element layers 370. The encapsulation layer 390 may include a plurality of layers, and may be formed of a stacked layer including at least one inorganic layer and at least one organic layer. For example, the encapsulation layer 390 may be formed of a triple layer in which a first inorganic layer 390a, an organic layer 390b, and a second inorganic layer 390c are sequentially stacked.

The touch portion 2000 may be disposed on the encapsulation layer 390 of the display portion 1000.

A first insulating layer 410 is disposed on the encapsulation layer 390. The first insulating layer 410 may be formed of an inorganic layer such as a metal oxide, a metal oxynitride, a silicon oxide, a silicon nitride, and a silicon oxynitride, or an organic layer. The first insulating layer 410 protects the encapsulation layer 390 by covering the encapsulation layer 390, and prevents moisture permeation. In addition, the first insulating layer 410 may reduce parasitic capacitance between the common electrode 270 and a touch electrode included in the touch portion 2000.

A first touch cell connection portion 452 is disposed on the first insulating layer 410, and a second insulating layer 420 is disposed on the first touch cell connection portion 452. The second insulating layer 420 may be formed of an inorganic layer such as a metal oxide, a metal oxynitride, a silicon oxide, a silicon nitride, and a silicon oxynitride, or an organic layer.

A first touch cell 451 is disposed on the second insulating layer 420. In addition, although it is not illustrated in FIG. 1, a second touch cell and a second touch cell connection portion may also be disposed on the second insulating layer 420. In this case, one of the first touch cell 451 and the second touch cell may be a detection input electrode, and the other may be a detection output electrode. The first touch cell 451 and the second touch cell may be electrically separated from each other, and may be dispersed and disposed in a mesh format not to overlap each other in a plan view. The first touch cells 451 may be connected with each other by the first touch cell connection portion 452, and the second touch cells may be connected with each other by the second touch cell connection portion.

A touch cell protection layer 430 may be disposed on the first touch cell 451 and the second touch cell (not shown). The touch cell protection layer 430 can protect the first touch cell 451 and the second touch cell by covering the first touch cell 451 and the second touch cell to prevent the first touch cell 451 and the second touch cell from being exposed to the outside. The touch cell protection layer 430 may include an inorganic material such as a silicon oxynitride nitride ($SiN_x$) or a silicon oxide ($SiO_2$), or a polyacrylate resin, a polyimide resin, and an acryl-based organic material.

The anti-reflection portion 3000 is disposed on the touch portion 2000.

The anti-reflection portion 3000 includes a light blocking layer 520 and color filters 530A, 530B, and 530C. The color filters 530A, 530B, and 530C may be collectively referred to as color filters 530, or individually referred to as a color filter 530.

The light blocking layer 520 overlaps the pixel defining layer 360 of the display portion 1000 in a plan view, and may have a narrower width than the pixel defining layer 360. The light blocking layer 520 may be disposed over the peripheral area PA.

The light blocking layer 520 includes a plurality of openings 521 overlapping the pixel openings 365 of the pixel defining layer 360, and each opening 521 may overlap a corresponding one of the pixel openings 365. A width of the opening 521 of the light blocking layer 520 may be wider than a width of the corresponding pixel opening 365.

The color filters 530A, 530B, and 530C are disposed on the light blocking layer 520. Each of the color filters 530A, 530B, and 530C may be substantially disposed in the opening 521 of the light blocking layer 520. A planarization layer 540 may be disposed on the plurality of color filters 530A, 530B, and 530C.

The anti-reflection portion 3000 prevents the external light incident from the outside from being reflected by wires and the like in the display portion 1000 and/or the touch portion to be visually recognized. The light blocking layer 520 of the anti-reflection portion 3000 may be disposed to overlap the peripheral area PA and an edge of a light emitting area of the display area DA, and may absorb incident external light to reduce an amount of the external light incident on the light emitting area. As a result, a degree of visual recognition of external light due to reflection may be reduced.

The color filters 530A, 530B, and 530C of the anti-reflection portion 3000 may reduce visual recognition of external light incident from the outside and then reflected after being incident on the pixel defining layer 360 and the like. Since the color filters 530A, 530B, and 530C cannot completely block light, the anti-reflection portion 3000 may prevent the reflected light of the external light from being visually recognized without reducing an efficiency of light emitted from the light emitting element layers 370.

In general, a polarization layer (not shown) may be used to prevent visibility of reflected light from external light, but it may lower an efficiency of light emitted from the light emitting element layers 370. However, according to the embodiment, the anti-reflection portion 3000 may prevent visible reflection of external light without reducing the efficiency of light emitted from the light emitting element layers 370.

Figure 2:
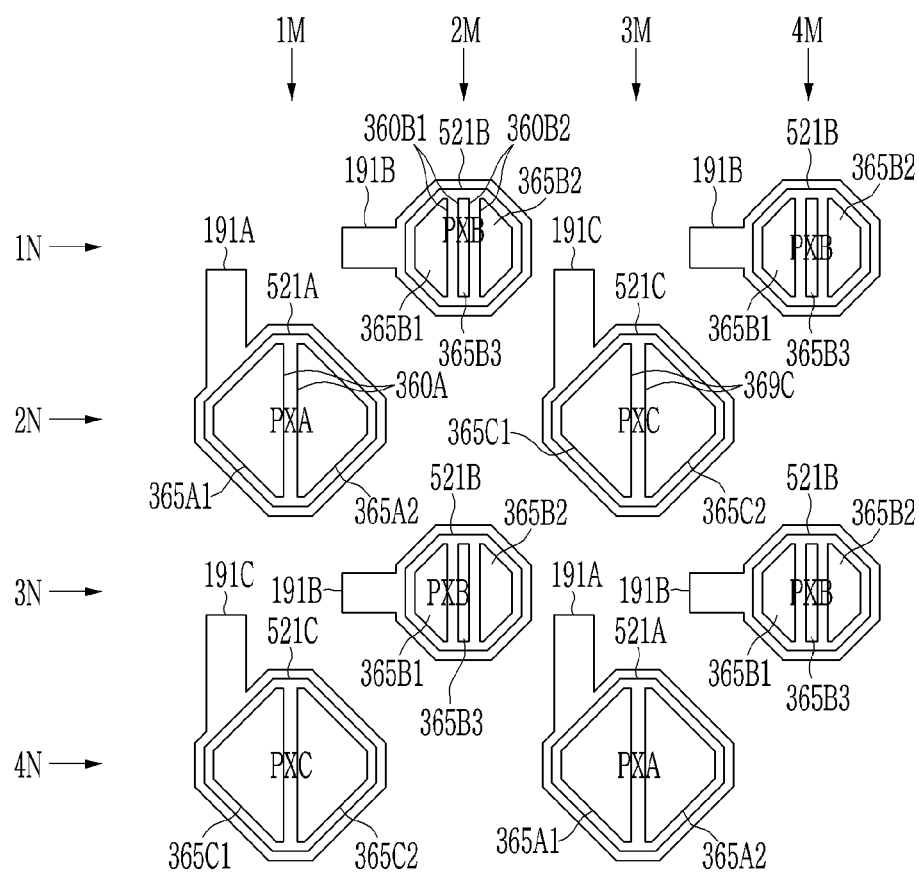
FIG. 2 is a layout view of an area of the display device according to an embodiment.

FIG. 2 is a layout view of an area of the display device 10 according to an embodiment.

First, pixel alignment of the display device 10 according to the embodiment will be described.

As shown in FIG. 2, the display device 10 includes a plurality of first pixels PXA, a plurality of second pixels PXB, and a plurality of third pixels PXC that display different colors.

In the display device 10, the plurality of second pixels PXB are disposed at a predetermined interval from each other in a first row 1N, the plurality of first pixels PXA and the plurality of third pixels PXC are alternately disposed in an adjacent second row 2N, the plurality of second pixels PXB are disposed at a predetermined interval from each other in an adjacent third row 3N, and the third pixels PXC and the first pixels PXA are alternately arranged in an adjacent fourth row 4N. Such a pixel row alignment repeats to an N-th row.

In this case, the plurality of second pixels PXB arranged in the first row 1N and the plurality of first pixels PXA and the plurality of third pixels PXC arranged in the second row 2N are arranged alternately in columns. For example, the first pixel PXA and the third pixel PXC are alternately arranged in a first column 1M, a plurality of second pixels PXB are arranged at a predetermined interval in an adjacent second column 2M, the third pixel PXC and the first pixel PXA are alternately arranged in an adjacent third column 3M, and a plurality of second pixels PXB are arranged at a predetermined interval in an adjacent fourth column 4M. Such a pixel column alignment repeats to an M-th column.

The first row 1N and the first column 1M described above do not necessarily refer to the first row and the first column of the display device 10, but refer to any row and any column of an arbitrary region.

Such a pixel alignment structure is referred to as a pentile matrix, and by sharing adjacent pixels to express colors, a high resolution display device may be implemented with a small number of pixels.

For example, the first pixel PXA may correspond to a red pixel displaying red, the second pixel PXB may correspond to a green pixel displaying green, and the third pixel PXC may correspond to a blue pixel displaying blue. However, this is an example, and the color displayed by each pixel PX may be variously changed.

Figure 3:
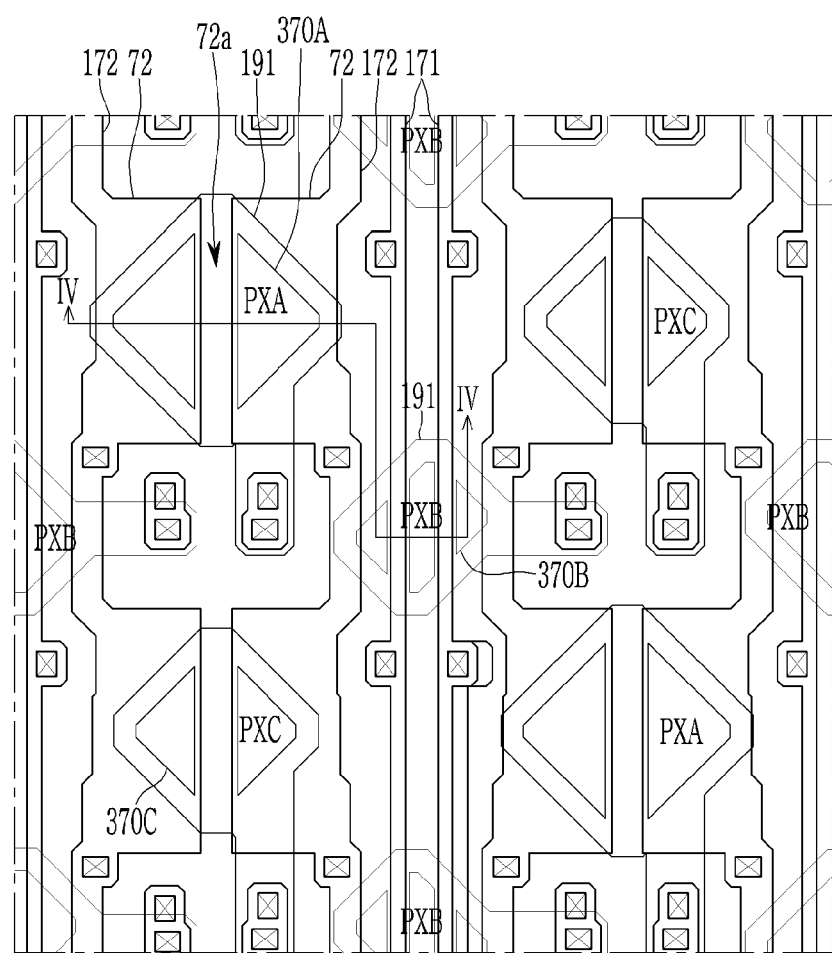
FIG. 3 is a layout view of a part of the display device according to an embodiment.
Figure 4:
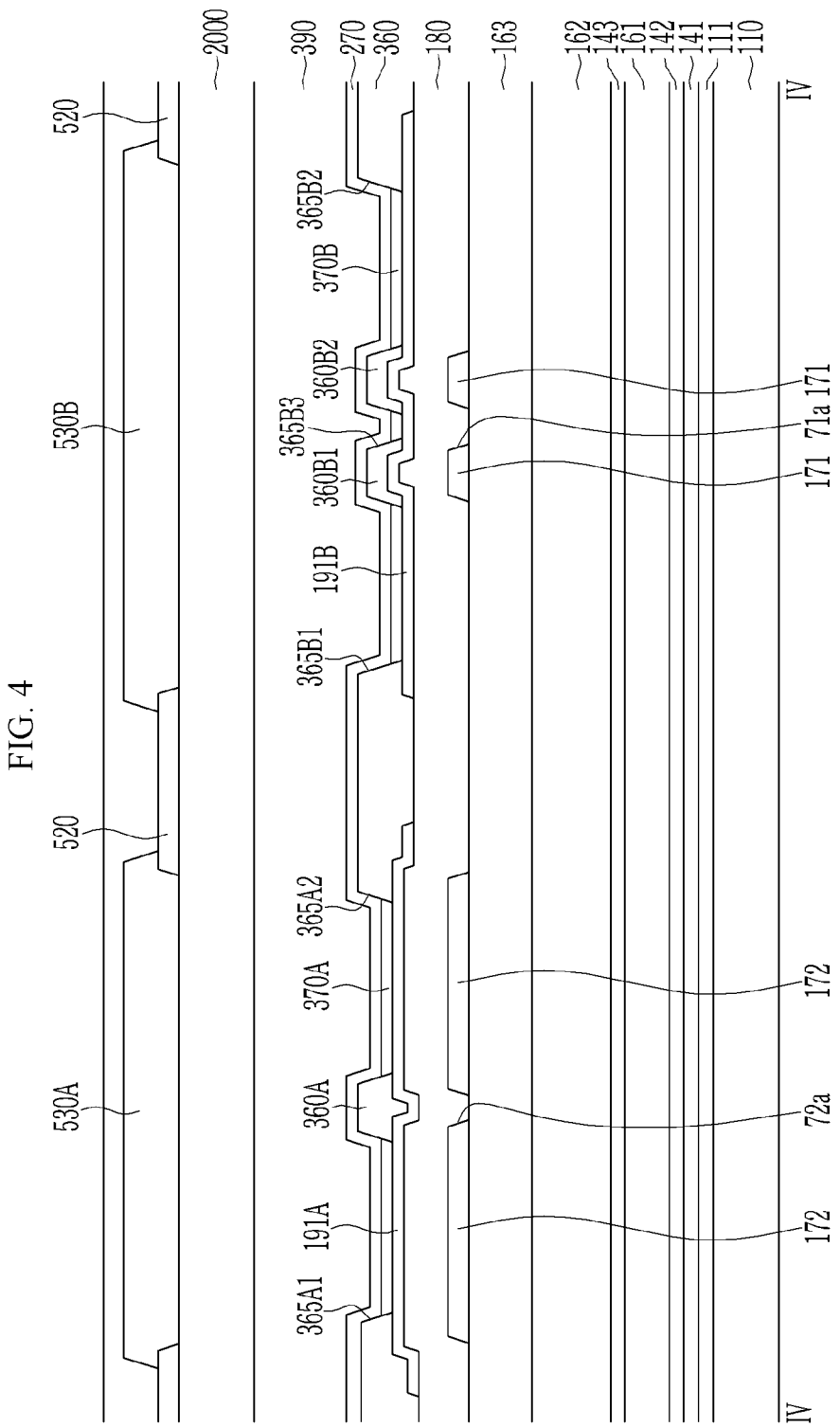
FIG. 4 is a cross-sectional view of FIG. 3, taken along the line IV-IV.

FIG. 3 is a layout view of a part of the display device 10 according to an embodiment, and FIG. 4 is a cross-sectional view of FIG. 3, taken along the line IV-IV. Alignment of the pixel openings 365 of the pixel defining layer 360 of the display portion 1000 and the anti-reflection portion 3000 will be described with reference to FIG. 3 and FIG. 4 together with FIG. 1 and FIG. 2.

The pixel defining layer 360 is disposed on a first pixel electrode 191A of the first pixel PXA, a second pixel electrode 191B of the second pixel PXB, and a third pixel electrode 191C of the third pixel PXC, and the pixel defining layer 360 includes a first pixel opening 365A overlapping the first pixel electrode 191A of the first pixel PXA, a second pixel opening 365B overlapping the second pixel electrode 191B of the second pixel PXB, and a third pixel opening 365C overlapping the third pixel electrode 191C of the third pixel PXC.

The first pixel opening 365A may include a first sub-pixel opening 365A1 and a second sub-pixel opening 365A2, and a first blocking portion 360A may be disposed between the first sub-pixel opening 365A1 and the second sub-pixel opening 365A2. The first blocking portion 360A may be formed of the same layer as the pixel defining layer 360, and may be extended from the pixel defining layer 360.

The second pixel opening 365B may include a third sub-pixel opening 365B1, a fourth sub-pixel opening 365B2, and a fifth sub-pixel opening 365B3 that is disposed between the third sub-pixel opening 365B1 and the fourth sub-pixel opening 365B2. The fifth sub-pixel opening 365B3 may be smaller than third sub-pixel opening 365B1 and the fourth sub-pixel opening 365B2 in size. The fifth sub-pixel opening 365B3 may be omitted in some embodiments. A second blocking portion 360B1 may be disposed between the third sub-pixel opening 365B1 and the fifth sub-pixel opening 365B3, and a third blocking portion 360B2 may be disposed between the fourth sub-pixel opening 365B2 and the fifth sub-pixel opening 365B3. The second blocking portion 360B1 and the third blocking portion 360B2 may be formed of the same layer as the pixel defining layer 360, and may extend from the pixel defining layer 360.

Similar to the first pixel opening 365A, the third pixel opening 365C may include a sixth sub-pixel opening 365C1 and a seventh sub-pixel opening 365C2, and a fourth blocking portion 360C may be disposed between the sixth sub-pixel opening 365C1 and the seventh sub-pixel opening 365C2. The fourth blocking portion 360C may be formed of the same layer as the pixel defining layer 360, and may extend from the pixel defining layer 360.

The first blocking portion 360A, the second blocking portion 360B1, the third blocking portion 360B2, and the fourth blocking portion 360C may overlap a step portion of the pixel electrode 191. Referring to FIG. 3 and FIG. 4, the step portion of the pixel electrode 191 may correspond to a separation portion 71a between adjacent data lines 171 or a portion overlapping an opening 72a of the driving voltage line 172.

The pixel defining layer 360, the first blocking portion 360A, the second blocking portion 360B1, the third blocking portion 360B2, and the fourth blocking portion 360C may include a black dye and may block light.

The light emitting element layers 370 may be disposed in each of the first pixel opening 365A, the second pixel opening 365B, and the third pixel opening 365C.

The light blocking layer 520 of the anti-reflection portion 3000 is disposed to overlap the pixel defining layer 360. A width of the light blocking layer 520 may be narrower than a width of the pixel defining layer 360.

The light blocking layer 520 includes a first opening 521A overlapping a first light emitting element layer 370A, a second opening 521B overlapping a second light emitting element layer 370B, and a third opening 521C overlapping a third light emitting element layer 370C.

The first opening 521A of the light blocking layer 520 overlaps the first pixel opening 365A of the pixel defining layer 360, the second opening 521B overlaps the second pixel opening 365B, and the third opening 521C overlaps the third pixel opening 365C.

An area of the first opening 521A may be larger than an area of the first pixel opening 365A, an area of the second opening 521B may be larger than an area of the second pixel opening 365B, and an area of the third opening 521C may be larger than an area of the third pixel opening 365C.

In a case where a width of the light blocking layer 520 is narrower than a width of the corresponding pixel defining layer 360, the light blocking layer 520 may prevent external light incident on the pixel defining layer 360 from being viewed due to reflection while not interrupting a path of light emitted from the first light emitting element layer 370A, the second light emitting element layer 370B, and the third light emitting element layer 370C, thereby preventing deterioration of contrast due to reflection of external light.

In the light blocking layer 520, a first color filter 530A is disposed in the first opening 521A, a second color filter 530B is disposed in the second opening 521B, and a third color filter 530C is disposed in the third opening 521C.

The first color filter 530A, the second color filter 530B, and the third color filter 530C may respectively transmit light of substantially the same wavelength as light emitted from first light emitting element layer 370A, the second light emitting element layer 370B, and third light emitting element layer 370C. The first color filter 530A, the second color filter 530B, and the third color filter 530C may prevent externally incident light from being viewed due to reflection in the display portion 1000, while not significantly interrupting a path of light emitted from the first light emitting element layer 370A, the second light emitting element layer 370B, and the third light emitting element layer 370C, thereby preventing deterioration of light transmittance, while preventing contrast deterioration.

As previously described, the first blocking portion 360A, the second blocking portion 360B1, the third blocking portion 360B2, and the fourth blocking portion 360C that block light may be disposed at positions that overlap the step portions of the pixel electrode 191. Accordingly, reflection of external light that is incident by the steps of the pixel electrode 191 that are formed by signal lines such as the data line 171 and the driving voltage line 172 can be prevented.

When the passivation layer 180 that is disposed below the pixel electrode 191 is sufficiently thick, the steps formed due to the signal wires such as the data line 171 and the driving voltage line 172 disposed below the passivation layer 180 may not affect the pixel electrode 191. However, when the passivation layer 180 is too thick, internal gas that may be generated during a baking process for forming the passivation layer 180 and the second and third insulating layers 162 and 163 disposed below the passivation layer 180 may not be sufficiently discharged to the outside, so deterioration of the light emitting element layers 370 or discoloration of organic elements included therein may occur, thereby deteriorating light emission characteristic of the light emitting element layers 370.

Thus, the passivation layer 180 may be sufficiently thin to be able to discharge the internal gas that may be generated during the process for forming the insulating layers 162 and 163 that contain an organic material. As a result, the pixel electrode 191 may be influenced by the steps that are formed due to the signal wires such as the data line 171 and the driving voltage line 172 disposed below the passivation layer 180, and a step may be formed on the surface of the pixel electrode 191.

However, in the display device 10 according to the embodiment, the pixel defining layer 360 includes the first blocking portion 360A, the second blocking portion 360B1, the third blocking portion 360B2, and the fourth blocking portion 360C that respectively overlap the step portions of the pixel electrode 191 and are capable of blocking light, and thus light incident from the outside can be prevented from being reflected by the step portions of the pixel electrode 191 and viewed from the outside.

Figure 6:
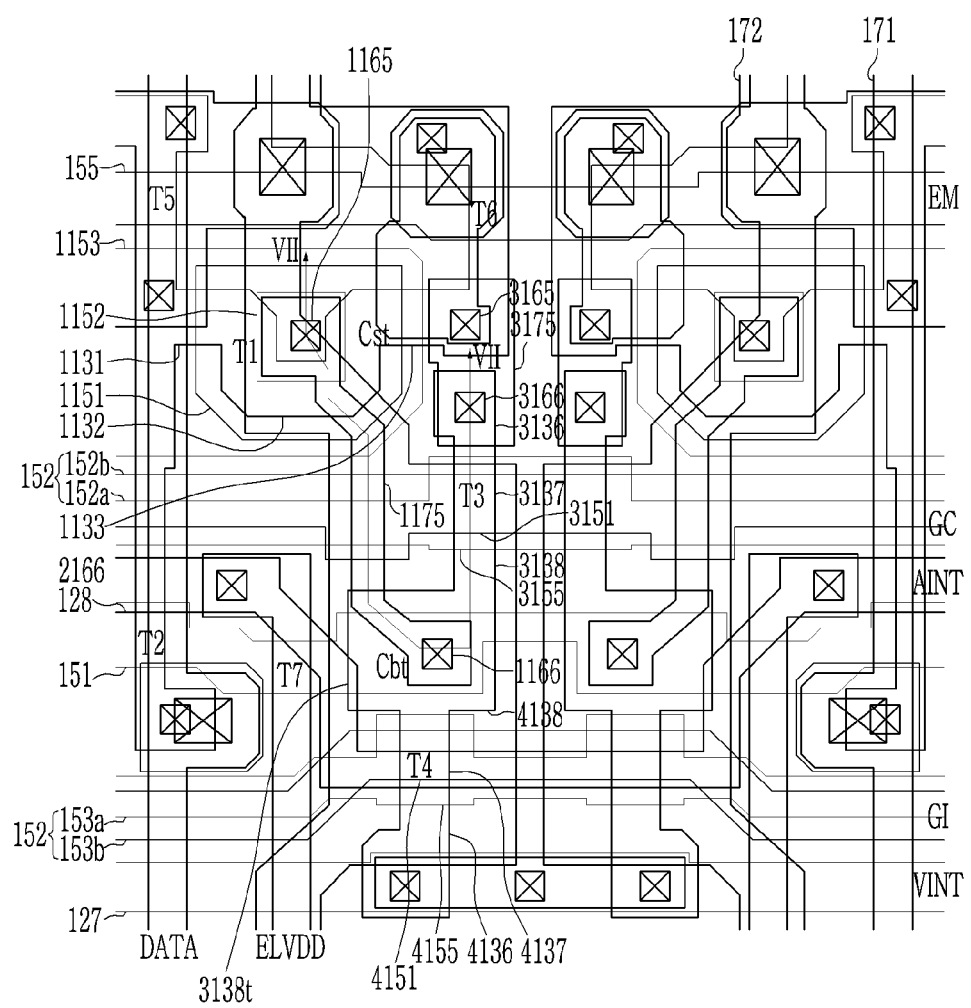
FIG. 6 is a top plan view of the display device according to an embodiment.
Figure 7:
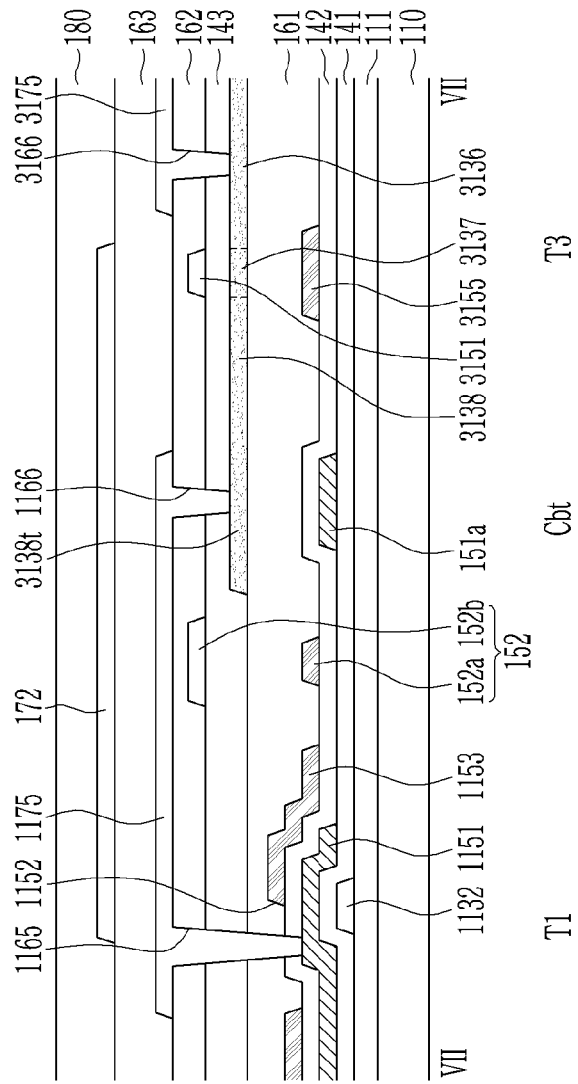
FIG. 7 is a cross-sectional view of FIG. 6, taken along the line VII-VII.

Next, referring to FIG. 5 to FIG. 14, a pixel PX of the display portion 1000 of the display device 10 according to an embodiment will be described in more detail. FIG. is a circuit diagram of the pixel PX of the display device 10 according to an embodiment, FIG. 6 is a top plan view of the display device 10 according to an embodiment, and FIG. 7 is a cross-sectional view of FIG. 6, taken along the line VII-VII. FIG. 8 to FIG. 14 are top plan views that sequentially illustrate a manufacturing process of the display device 10 according to an embodiment.

Figure 5:
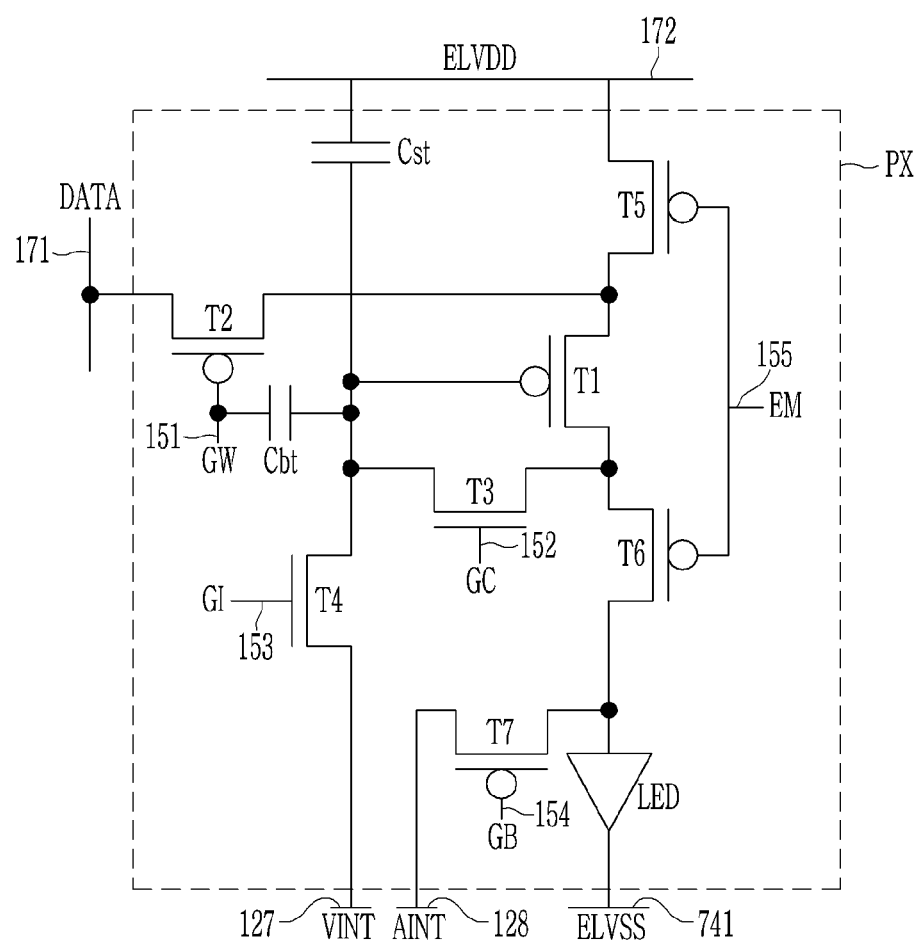
FIG. 5 is a circuit diagram of a pixel according to an embodiment.

As shown in FIG. 5, the pixel PX includes a plurality of transistors including a driving transistor T1, a second transistor T2, a third transistor T3, a fourth transistor T4, a fifth transistor T5, a sixth transistor T6, and a seventh transistor T7, a storage capacitor Cst, a boost capacitor Cbt, and a light emitting diode LED.

The pixel PX is connected with a plurality of wires including a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a gate driver (not shown) and transmits a first scan signal GW to the second transistor T2. The second scan line 152 transmits a second scan signal GC to the third transistor T3. The second scan signal GC transmitted by the second scan line 152 may have an opposite polarity to the first scan signal GW transmitted by the first scan line 151, and the first scan signal GW and the second scan signal GC may be applied at the same timing. For example, when a negative voltage is applied to the first scan line 151, a positive voltage may be applied to the second scan line 152.

The initialization control line 153 transmits an initialization control signal GI to the fourth transistor T4. The bypass control line 154 transmits a bypass signal GB to the seventh transistor T7. The bypass control line 154 may be a first scan line 151 of a previous stage. The light emission control line 155 transmits a light emission control signal EM to the fifth transistor T5 and the sixth transistor T6.

The data line 171 transmits data voltage DATA generated in a data driver (not shown), and luminance of light emitted from the light emitting diode LED is changed according to the data voltage DATA applied to the pixel PX.

The driving voltage line 172 provides a driving voltage ELVDD. The first initialization voltage line 127 transmits a first initialization voltage VINT, and the second initialization voltage line 128 transmits a second initialization voltage AINT. The common voltage line 741 provides a common voltage ELVSS to a cathode of the light emitting diode LED. In the present embodiment, each of the driving voltage line 172, the first and second initialization voltage lines 127 and 128, and the common voltage line 741 may be applied with a constant voltage.

The plurality of transistors T1 to T7 may be formed of an oxide transistor including an oxide semiconductor, and/or a polycrystalline transistor including a polycrystalline semiconductor. For example, the third transistor T3 and the fourth transistor T4 may be formed of oxide transistors, and the driving transistor T1, the second transistor T2, the fifth transistor T5, the sixth transistor T6, and the seventh transistor T7 may be formed of polycrystalline transistors. However, the present disclosure is not limited thereto, and the plurality of transistors T1 to T7 may be formed of polycrystalline transistors.

Although FIG. 5 illustrates that the pixel PX includes seven transistors T1 to T7, one storage capacitor Cst, and one boost capacitor Cbt, the present disclosure is not limited thereto, and the number of transistors and the number of capacitors included in the pixel PX, and their connection relationships can be variously modified without deviating from the scope of the present disclosure.

Next, referring to FIG. 6 to FIG. 14, an interlayer structure of the pixel PX of the display portion 1000 of the display device 10 according to an embodiment will be described in more detail.

Figure 8:
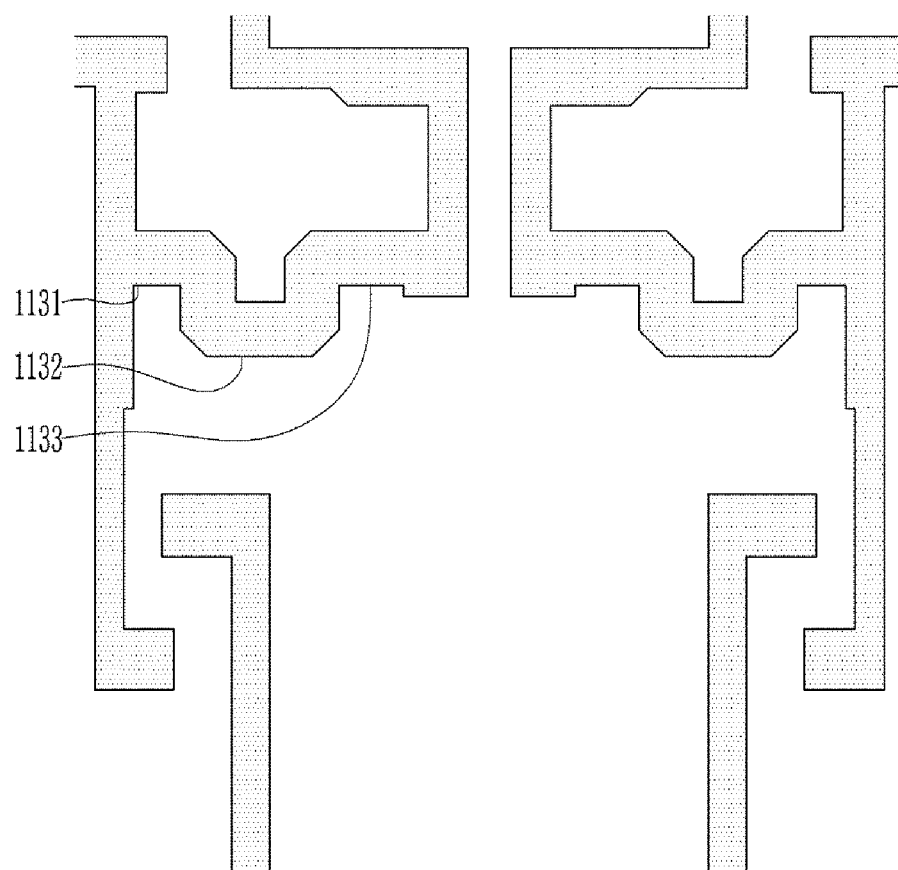
FIG. 8, FIG. 9, FIG. 10, FIG. 11, FIG. 12, FIG. 13, and FIG. 14 are top plan views that sequentially illustrate a manufacturing process of the display device according to an embodiment.

The buffer layer 111 is disposed on the substrate 100, and a polycrystalline semiconductor layer that includes a channel 1132, a first region 1131, and a second region 1133 of the driving transistor T1 may be disposed on the buffer layer 111 as illustrated in FIG. 8. The polycrystalline semiconductor layer may further include channels, first regions, and second regions of the second transistor T2, the fifth transistor T5, the sixth transistor T6, and the seventh transistor T7.

The channel 1132 of the driving transistor T1 may have a curved shape on a plane. However, the shape of the channel 1132 of the driving transistor T1 is not limited thereto, and may be various modified. For example, the channel 1132 of the driving transistor T1 may be curved in different shapes, and may have a shape of a rod. The first region 1131 and the second region 1133 of the driving transistor T1 may be disposed at opposite sides of the channel 1132 of the driving transistor T1. The first region 1131 of the driving transistor T1 may extended downwardly to be connected with a second region of the second transistor T2 and may extend upwardly to be connected with a second region of the fifth transistor T5 in a plan view. The second region 1133 of the driving transistor T1 may extend upwardly to be connected with a first region of the sixth transistor T6.

The first gate insulating layer 141 may be disposed on the polycrystalline semiconductor layer that includes the channel 1132, the first region 1131, and the second region 1133 of the driving transistor T1.

Figure 9:
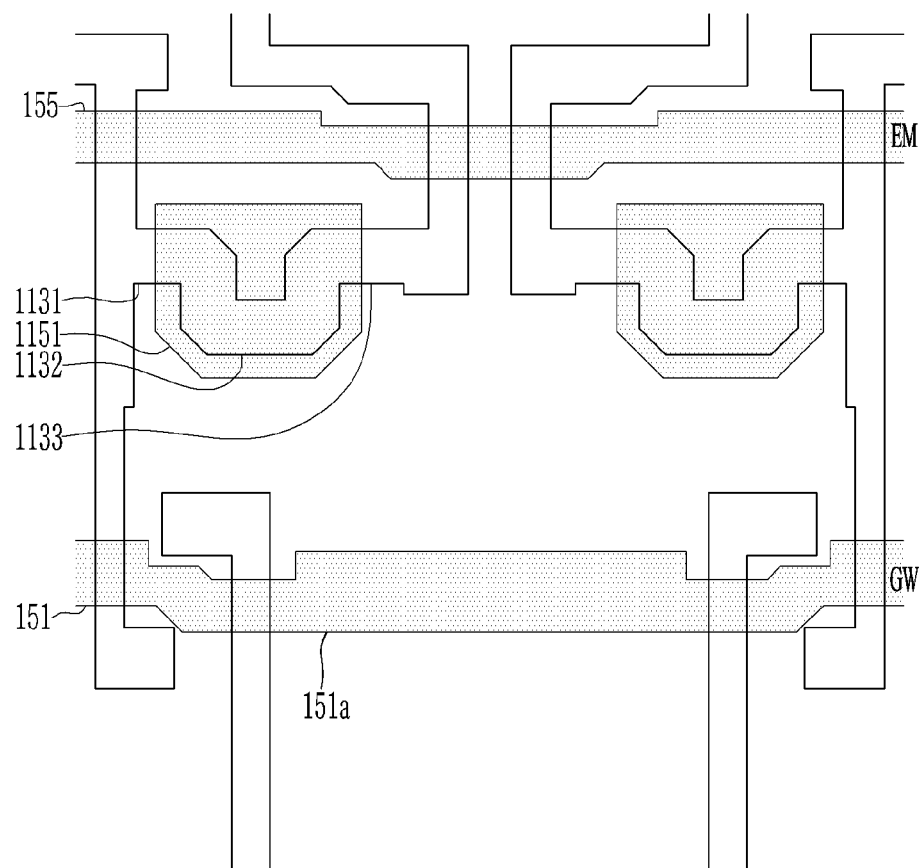

A first gate conductor including a gate electrode 1151 of the driving transistor T1 may be disposed on the first gate insulating layer 141. FIG. 9 illustrates the polycrystalline semiconductor layer and the first gate conductor. The first gate conductor may further include a gate electrode of each of the second transistor T2, the fifth transistor T5, the sixth transistor T6, and the seventh transistor T7 in addition to the gate electrode 1151 of the driving transistor T1.

The gate electrode 1151 of the driving transistor T1 may overlap the channel 1132 of the driving transistor T1. The channel 1132 of the driving transistor T1 is covered by the gate electrode 1151 of the driving transistor T1.

The first gate conductor may further include the first scan line 151 and the light emission control line 155. The first scan line 151 and the light emission control line 155 may extend substantially in a horizontal direction. The first scan line 151 may be integrally formed with the gate electrode of the second transistor T2. The first scan line 151 may include a lower boost electrode 151a of the boost capacitor Cbt. The bypass control line 154 connected to the seventh transistor T7 may be a first scan line 151 of a previous stage. The gate electrode of the fifth transistor T5 and the gate electrode of the sixth transistor T6 may be integrally formed with the light emission control line 155.

After forming the first gate conductor that includes the gate electrode 1151 of the driving transistor T1, a doping process may be performed. A portion of the polycrystalline semiconductor layer, covered by the first gate conductor may not be doped, and a portion of the polycrystalline semiconductor layer that is not covered by the first gate conductor may be selectively doped and thus may have the same characteristic as a conductor. The doping process may be carried out with a P-type dopant, and thus the driving transistor T1, the second transistor T2, the fifth transistor T5, the sixth transistor T6, and the seventh transistor T7 including the polycrystalline semiconductor layer may have a P-type transistor characteristic.

The second gate insulating layer 142 may be disposed on the first gate insulating layer 141 and the gate electrode 1151 of the driving transistor T1.

Figure 10:
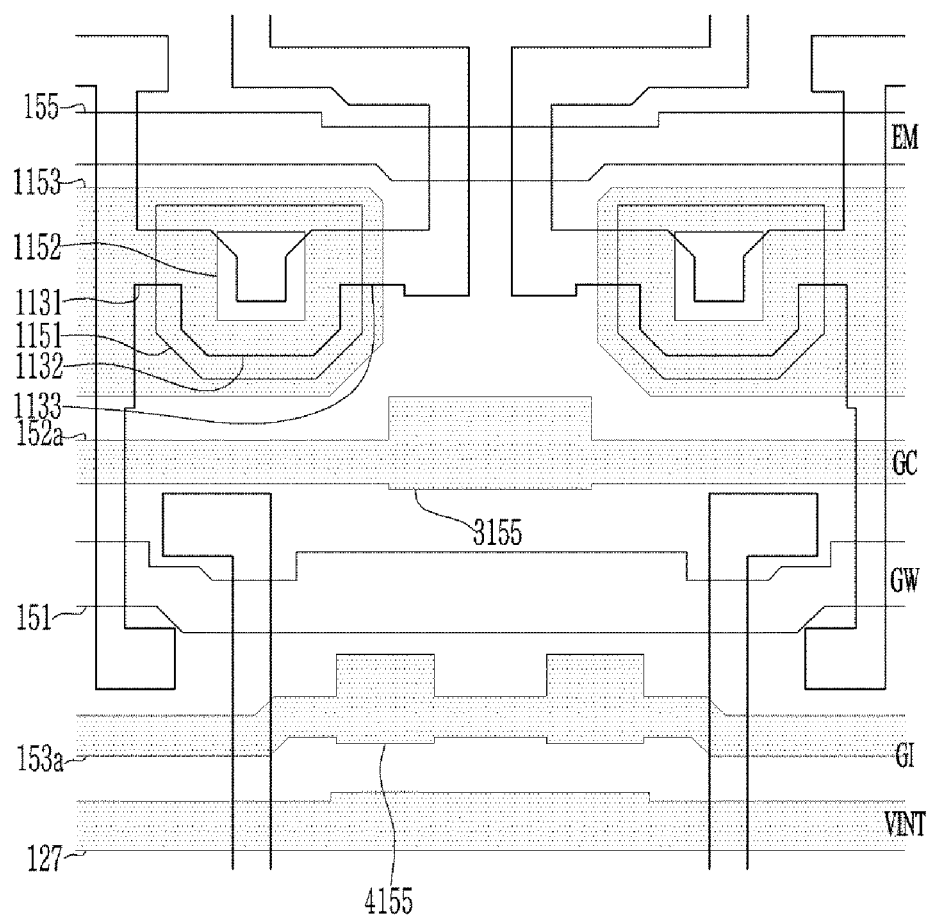

A second gate conductor that includes a first storage electrode 1153 of the storage capacitor Cst, a lower gate electrode 3155 of the third transistor T3, and a lower gate electrode 4155 of the fourth transistor T4 may be disposed on the second gate insulating layer 142. FIG. 10 illustrates the second gate conductor together with the polycrystalline semiconductor layer and the first gate conductor.

The first storage electrode 1153 of the storage capacitor Cst overlaps the gate electrode 1151 of the driving transistor T1. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The lower gate electrode 3155 of the third transistor T3 may overlap a channel 3137 and an upper gate electrode 3151 of the third transistor T3. The lower gate electrode 4155 of the fourth transistor T4 may overlap a channel 4137 and an upper gate electrode 4151 of the fourth transistor T4.

The second gate conductor may further include a lower second scan line 152a, a lower initialization control line 153a, and the first initialization voltage line 127.

The lower second scan line 152a, the lower initialization control line 153a, and the first initialization voltage line 127 may extend substantially in the horizontal direction. The lower second scan line 152a may be integrally formed with the lower gate electrode 3155 of the third transistor T3. The lower initialization control line 153a may be integrally formed with the lower gate electrode 4155 of the fourth transistor T4.

The first interlayer insulating layer 161 may be disposed on the second gate conductor that includes the first storage electrode 1153 of the storage capacitor Cst, the lower gate electrode 3155 of the third transistor T3, and the lower gate electrode 4155 of the fourth transistor T4.

Figure 11:
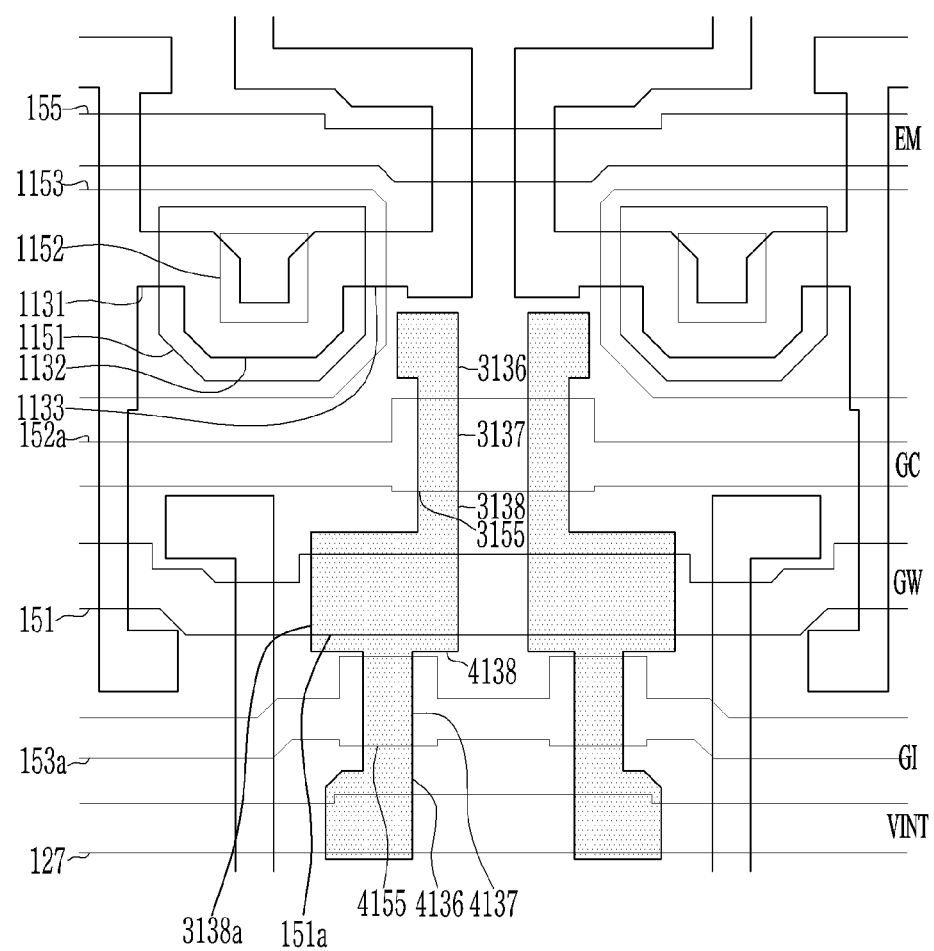

An oxide semiconductor layer that includes the channel 3137, a first region 3136, and a second region 3138 of the third transistor T3 and the channel 4137, a first region 4136, and a second region 4138 of the fourth transistor T4 may be disposed on the first interlayer insulating layer 161. FIG. 11 illustrates the oxide semiconductor layer together with the polycrystalline semiconductor layer, the first gate conductor, and the second gate conductor.

The channel 3137, the first region 3136, and the second region 3138 of the third transistor T3, and the channel 4137, the first region 4136, and the second region 4138 of the fourth transistor T4 may be connected to each other and may be integrally formed with each other. The first region 3136 and the second region 3138 of the third transistor T3 may be disposed at opposite sides of the channel 3137 of the third transistor T3. The first region 4136 and the second region 4138 of the fourth transistor T4 may be disposed at opposite sides of the channel 4137 of the fourth transistor T4. The second region 3138 of the third transistor T3 may be connected with the second region 4138 of the fourth transistor T4. The channel 3137 of the third transistor T3 may overlap the lower gate electrode 3155 of the third transistor T3. The channel 4137 of the fourth transistor T4 may overlap the lower gate electrode 4155 of the fourth transistor T4.

The third gate insulating layer 143 may be disposed on the oxide semiconductor that includes the channel 3137, the first region 3136, and the second region 3138 of the third transistor T3, and the channel 4137, the first region 4136, and the second region 4138 of the fourth transistor T4. The third gate insulating layer 143 may be disposed over the oxide semiconductor layer and the first interlayer insulating layer 161. For example, the third gate insulating layer 143 may cover top surfaces and side surfaces of the channel 3137, the first region 3136, and the second region 3138 of the third transistor T3, and the channel 4137, the first region 4136, and the second region 4138 of the fourth transistor T4. However, the present disclosure is not limited thereto, and the third gate insulating layer 143 may not be disposed on the entire surface of the oxide semiconductor layer and the first interlayer insulating layer 161. For example, the third gate insulating layer 143 may overlap the channel 3137 of the third transistor T3, but may not overlap the first region 3136 and the second region 3138 of the third transistor T3. In addition, the third gate insulating layer 143 may overlap the channel 4137 of the fourth transistor T4, but may not overlap the first region 4136 and the second region 4138 of the fourth transistor T4.

Figure 12:
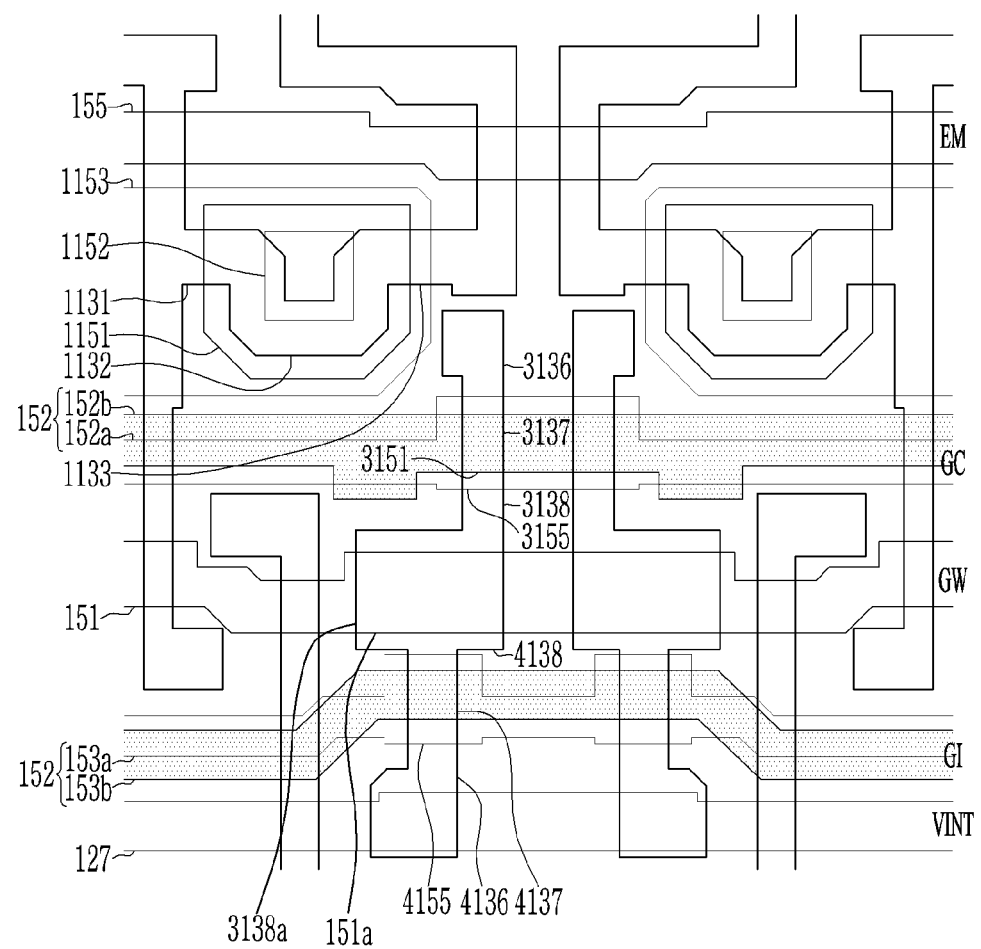

A third gate conductor including the upper gate electrode 3151 of the third transistor T3 and the upper gate electrode 4151 of the fourth transistor T4 may be disposed on the third gate insulating layer 143. FIG. 12 illustrates the third gate conductor together with the polycrystalline semiconductor layer, the first gate conductor, the second gate conductor, the oxide semiconductor layer, and the third gate conductor.

The upper gate electrode 3151 of the third transistor T3 may overlap the channel 3137 and the lower gate electrode 3155 of the third transistor T3.

The upper gate electrode 4151 of the fourth transistor T4 may overlap the channel 4137 and the lower gate electrode 4155 of the fourth transistor T4.

The third gate conductor may further include an upper second scan line 152b, an upper initialization control line 153b, and a first connection electrode 2175.

The upper second scan line 152b and the upper initialization control line 153b may extend substantially in the horizontal direction. The upper second scan line 152b may be connected with the upper gate electrode 3151 of the third transistor T3. The upper second scan line 152b may be integrally formed with the upper gate electrode 3151 of the third transistor T3. The lower initialization control line 153a and the upper initialization control line 153b form the initialization control line 153. The upper initialization control line 153b is connected with the upper gate electrode 4151 of the fourth transistor T4. The upper initialization control line 153b may be formed integrally with the upper gate electrode 4151 of the fourth transistor T4.

After forming the third gate conductor that includes the upper gate electrode 3151 of the third transistor T3 and the upper gate electrode 4151 of the fourth transistor T4, a doping process may be carried out. A portion of the oxide semiconductor layer that is covered by the third gate conductor may not be doped, and a portion of the oxide semiconductor layer that is not covered by the third gate conductor may be selectively doped and thus may have the same characteristic as a conductor. The channel 3137 of the third transistor T3 may be disposed below the upper gate electrode 3151 to overlap the upper gate electrode 3151. The first region 3136 and the second region 3138 of the third transistor T3 may not overlap the upper gate electrode 3151. The channel 4137 of the fourth transistor T4 may be disposed below the upper gate electrode 4151 to overlap the upper gate electrode 4151. The first region 4136 and the second region 4138 of the fourth transistor T4 may not overlap the upper gate electrode 4151. An upper boost electrode 3138a of the boost capacitor Cbt may not overlap the third gate conductor. The doping process of the oxide semiconductor layer may be carried out with an N-type dopant, and thus the third transistor T3 and the fourth transistor T4 including the oxide semiconductor layer may have an N-type transistor characteristic.

The second interlayer insulating layer 162 may be disposed on the third gate conductor that includes the upper gate electrode 3151 of the third transistor T3 and the upper gate electrode 4151 of the fourth transistor T4. The second interlayer insulating layer 162 may have a single-layered or multi-layered structure. The second interlayer insulating layer 162 may include an inorganic insulating material such as a silicon nitride ($SiN_x$), a silicon oxide ($SiO_x$), a silicon oxynitride ($SiO_xN_y$), and the like. The second interlayer insulating layer 162 may include a third opening 1165, a fourth opening 1166, a fifth opening 3165, and a sixth opening 3166.

The third opening 1165 may overlap at least a part of the gate electrode 1151 of the driving transistor T1. The third opening 1165 may be further formed in the third gate insulating layer 143, the first interlayer insulating layer 161, and the second gate insulating layer 142. The third opening 1165 may overlap the opening 1152 of the first storage electrode 1153. The third opening 1165 may be disposed inside the opening 1152 of the first storage electrode 1153. The fourth opening 1166 may overlap at least a part of the boost capacitor Cbt. The fourth opening 1166 may be further formed in the third gate insulating layer 143.

The fifth opening 3165 may overlap at least a part of the second region 1133 of the driving transistor T1. The fifth opening 3165 may be further formed in the third gate insulating layer 143, the first interlayer insulating layer 161, the second gate insulating layer 142, and the first gate insulating layer 141. The sixth opening 3166 may overlap at least a part of the first region 3136 of the third transistor T3. The sixth opening 3166 may be further formed in the third gate insulating layer 143.

Figure 13:
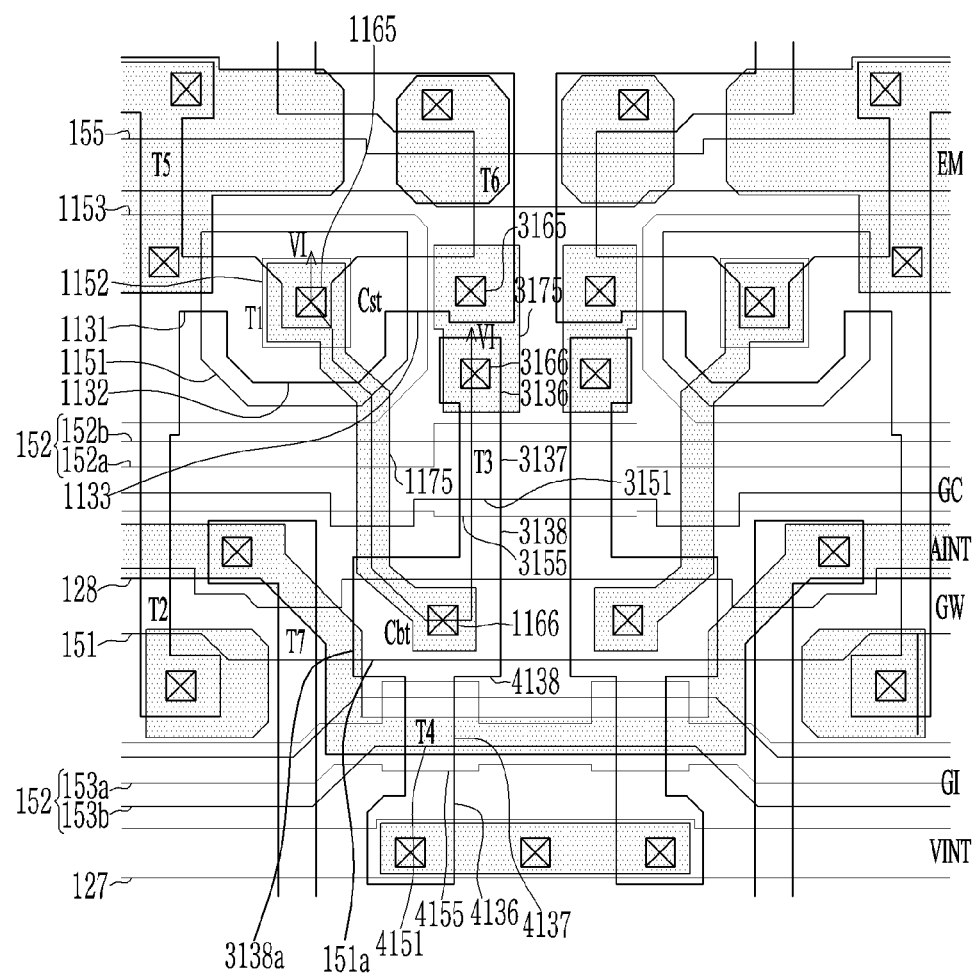

A first data conductor that includes a second connection electrode 1175 and a third connection electrode 3175 may be disposed on the second interlayer insulating layer 162. FIG. 13 illustrates the first data conductor together with the polycrystalline semiconductor layer, the first gate conductor, the second gate conductor, the oxide semiconductor layer, the third gate conductor.

The second connection electrode 1175 may overlap the gate electrode 1151 of the driving transistor T1. The second connection electrode 1175 may be connected with the gate electrode 1151 of the driving transistor T1 through the third opening 1165 of the second interlayer insulating layer 162 and the opening 1152 of the first storage electrode 1153. The second connection electrode 1175 may extend to overlap the boost capacitor Cbt. The second connection electrode 1175 may be connected with the upper boost electrode 3138a of the boost capacitor Cbt through the fourth opening 1166 of the second interlayer insulating layer 162. Thus, the gate electrode 1151 of the driving transistor T1 and the upper boost electrode 3138a of the boost capacitor Cbt may be connected by the second connection electrode 1175. The gate electrode 1151 of the driving transistor T1 may also be connected with the second region 3138 of the third transistor T3 and the second region 4138 of the fourth transistor T4 by the second connection electrode 1175.

The third connection electrode 3175 may overlap the second region 1133 of the driving transistor T1. The third connection electrode 3175 may be connected with the second region 1133 of the driving transistor T1 through the fifth opening 3165 of the second interlayer insulating layer 162. The third connection electrode 3175 may also overlap the first region 3136 of the third transistor T3. The third connection electrode 3175 may be connected with the first region 3136 of the third transistor T3 through the sixth opening 3166 of the second interlayer insulating layer 162. Thus, the second region 1133 of the driving transistor T1 and the first region 3136 of the third transistor T3 may be connected by the third connection electrode 3175.

The first data conductor may further include the second initialization voltage line 128. The second initialization voltage line 128 may extend substantially in the horizontal direction.

The third interlayer insulating layer 163 may be disposed on the first data conductor that includes the second connection electrode 1175, the third connection electrode 3175, and the second initialization voltage line 128.

Figure 14:
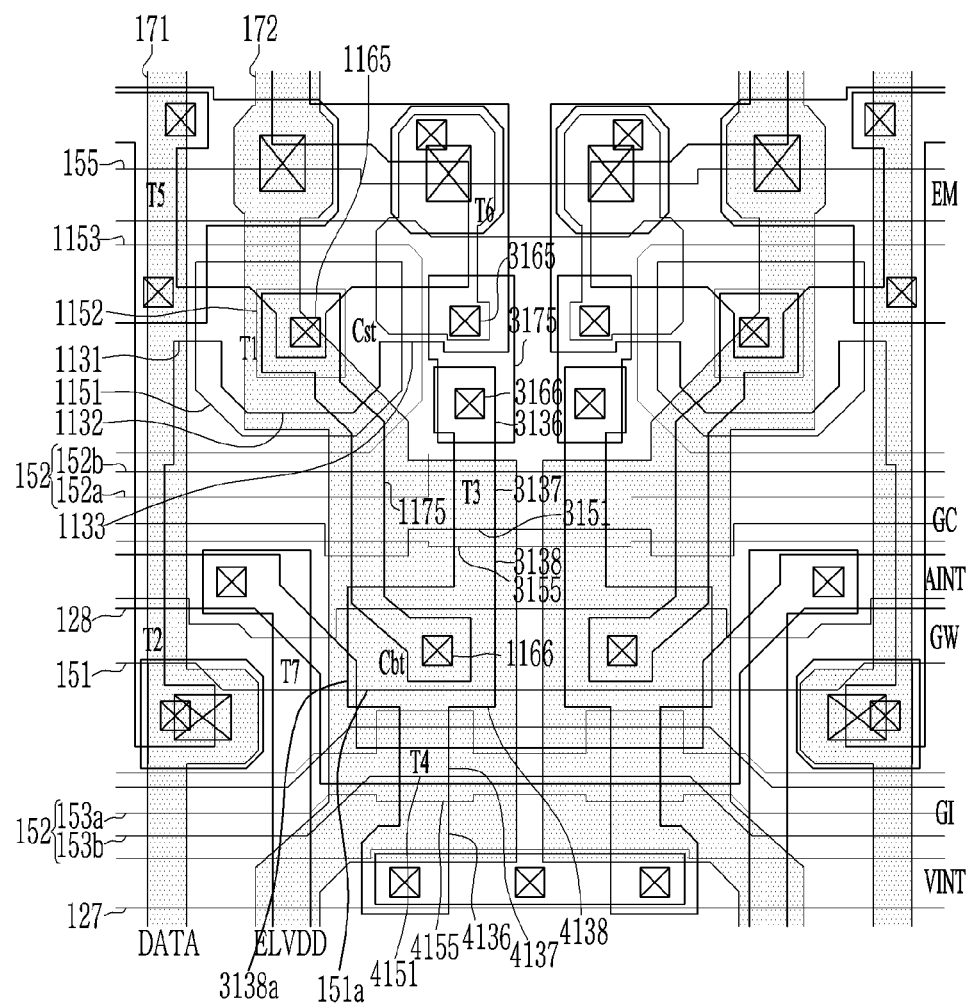

A second data conductor that includes the data line 171 and the driving voltage line 172 may be disposed on the third interlayer insulating layer 163. FIG. 14 illustrates the second data conductor together with the polycrystalline semiconductor layer, the first gate conductor, the second gate conductor, the oxide semiconductor layer, the third gate conductor, the first data conductor.

The data line 171 and the driving voltage line 172 may extend substantially in a vertical direction. The data line 171 may be connected with the second transistor T2. The driving voltage line 172 may be connected with the fifth transistor T5. In addition, the driving voltage line 172 may be connected with the first storage electrode 1153.

The passivation layer 180 may be disposed on the data line 171 and the driving voltage line 172. As illustrated in FIG. 1, the pixel electrode 191 may be disposed on the passivation layer 180. The pixel defining layer 360 may be disposed on the pixel electrode 191, and the light emitting element layers 370 may be disposed in the pixel openings 365 of the pixel defining layer 360. The common electrode 270 may be disposed on the pixel defining layer 360 and the light emitting element layers 370.

Figure 15:
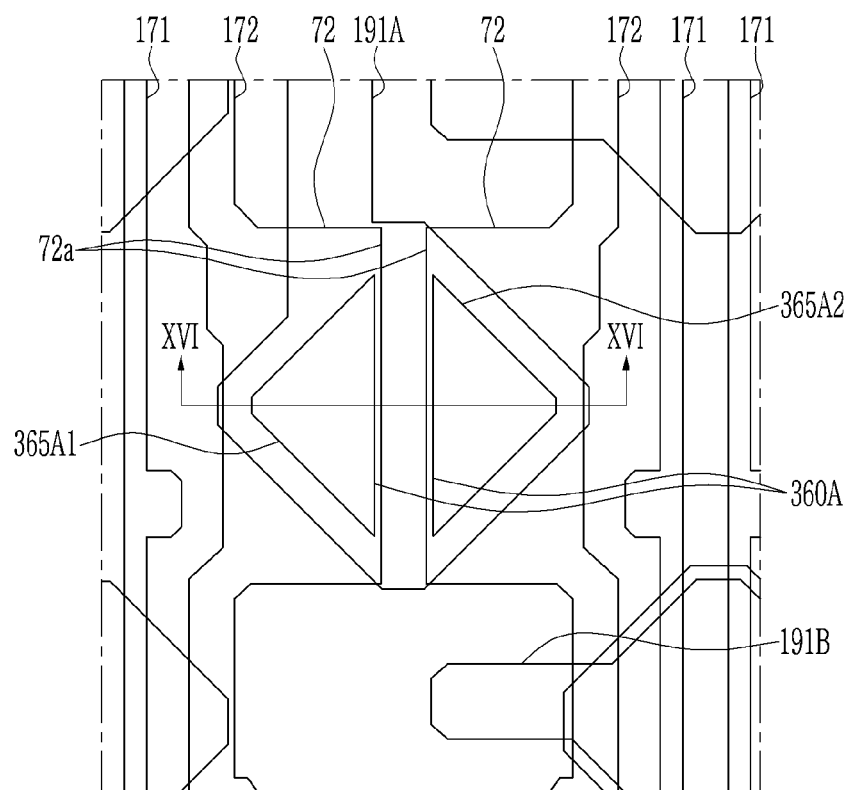
FIG. 15 is a top plan view of a part of a display device according to an embodiment.

Next, some structure of the first pixel PXA of the display device 10 according to an embodiment will be described in more detail. FIG. 15 is a top plan view of a part of the display device 10 according to an embodiment, and FIG. 16 is a cross-sectional view of FIG. 15, taken along the line XVI-XVI.

Figure 16:
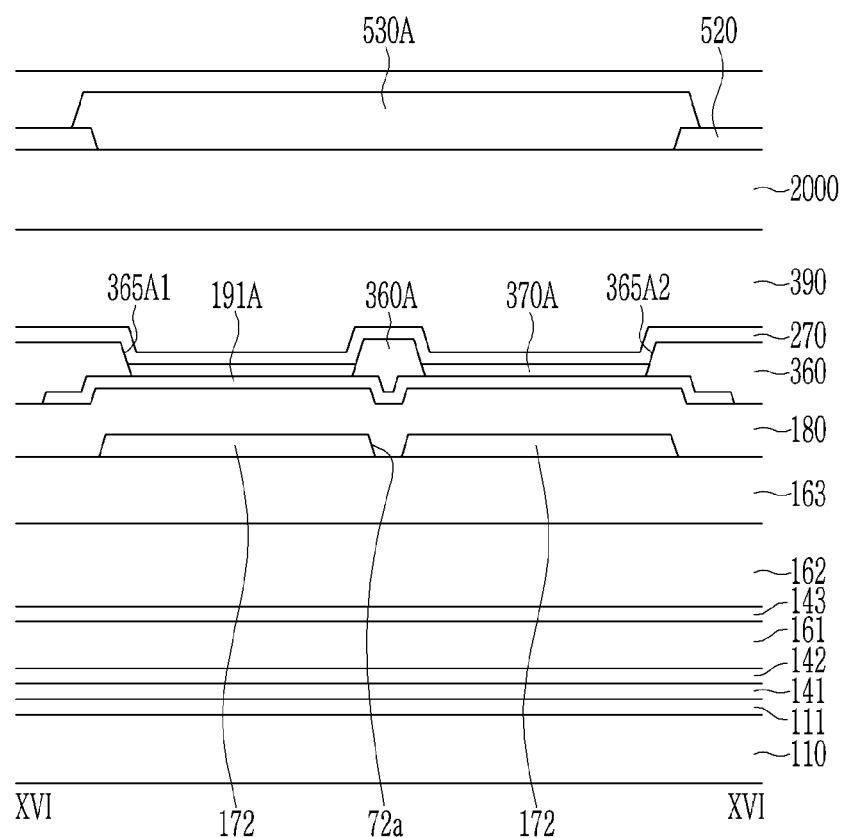
FIG. 16 is a cross-sectional view of FIG. 15, taken along the line XVI-XVI.

FIG. 15 and FIG. 16 illustrate a configuration disposed on the third interlayer insulating layer 163 of the display portion 1000, and the detailed structure of the display portion 1000 of the display device 10 is omitted. Although a configuration of the touch portion 2000 is not illustrated in FIG. 15 and FIG. 16, the interlayer structure and the pixel structure of the display portion 1000 and the structure of the touch portion 2000 of the display device 10 according to the above-described embodiment are equally applicable to the present embodiment without deviating from the scope of the present disclosure. In addition, detailed descriptions of the same constituent elements of the display device 10 according to the above-described embodiment will be omitted.

The buffer layer 111, the first gate insulating layer 141, the second gate insulating layer 142, the first interlayer insulating layer 161, the third gate insulating layer 143, the second interlayer insulating layer 162, and the third interlayer insulating layer 163 may be disposed on the substrate 110. As previously described, a configuration of a plurality of transistors (e.g., T1 to T7) may be disposed below the third interlayer insulating layer 163.

A plurality of data lines 171 and a plurality of driving voltage lines 172 may be disposed on the third interlayer insulating layer 163.

Two adjacent driving voltage lines 172 respectively may include expansion portions 72, and may be disposed spaced apart from each other by an opening 72a. An expansion portion 72 of a driving voltage line 172 may protrude from the driving voltage lines 172 toward the expansion portion 72 of an adjacent driving voltage line 172.

The passivation layer 180 may be disposed on the plurality of data lines 171 and the plurality of driving voltage lines 172. The first pixel electrode 191A may be disposed on the passivation layer 180, and the pixel defining layer 360 may be disposed on the first pixel electrode 191A and the passivation layer 180.

The pixel defining layer 360 may include the first blocking portion 360A. The pixel defining layer 360 and the first blocking portion 360A may define the first pixel opening 365A. The first pixel opening 365A may include the first sub-pixel opening 365A1 and the second sub-pixel opening 365A2. The first blocking portion 360A may be disposed between the first sub-pixel opening 365A1 and the second sub-pixel opening 365A2.

The first light emitting element layer 370A may be disposed in the first pixel opening 365A, and the common electrode 270 may be disposed on the pixel defining layer 360 and the first light emitting element layer 370A. The encapsulation layer 390 may be disposed on the common electrode 270.

The touch portion 2000 may be disposed on the encapsulation layer 390. A detailed configuration of the touch portion 2000 will be omitted.

The anti-reflection portion 3000 that includes the light blocking layer 520 and the first color filter 530A may be disposed on the touch portion 2000.

The expansion portion 72 of the driving voltage line 172 may prevent a signal delay of the driving voltage ELVDD, and when a signal line having the same area as the expansion portion 720 of the driving voltage line 172 is disposed on the passivation layer 180, internal gas that may be generated during a baking process for forming insulating layers that are disposed below the signal line and include organic materials may not be sufficiently discharged to the outside, thereby causing deterioration of the light emitting element layers 370, or deterioration of a light emission characteristic of the light emitting element layers 370 due to discoloration of an electrode layer of an organic element.

However, the two expansion portions 72 of the two adjacent driving voltage lines 172 of the display device 10 according to the present embodiment are disposed apart from each other by the openings 72a, and the internal gas that may be generated during a process for forming the insulating layer, may not be sufficiently discharged to the outside through the openings 72a.

In addition, when the passivation layer 180 disposed below the pixel electrode 191 is sufficiently thick, a step due to signal wires such as the data line 171 and the driving voltage line 172, which are disposed below the passivation layer 180, may not affect the pixel electrode 191, but when the thickness of the passivation layer 180 is too thick, internal gas that may be generated during a baking process for forming the passivation layer 180 and insulating layers below the passivation layer 180 may not be sufficiently discharged to the outside. Thus, the thickness of the passivation layer 180 is formed to be thin to discharge internal gas that may occur during the process of forming the insulating layer including an organic material.

Then, the pixel electrode 191 is influenced by a step due to the signal wires such as the data line 171 and the driving voltage line 172 disposed below the passivation layer 180 such that a step may be formed on the surface of the pixel electrode 191. In the present embodiment, in the first pixel PXA, a step may be formed in the first pixel electrode 191A due to the openings 72a of the two expansion portions 72 of the two adjacent driving voltage lines 172 that are disposed below the first pixel electrode 191A.

However, in the display device 10 according to the embodiment, the pixel defining layer 360 may include the first blocking portion 360A that overlaps the opening 72a between two expansion portion 72 of the two adjacent driving voltage lines 172, and blocks light.

Thus, although the pixel electrode 191 may have a step portion due to the step formed due to the two driving voltage lines 172 disposed below the passivation layer 180, externally incident light can be prevented from being reflected by the step portion of the pixel electrode 191 and passing through the first color filter 530A by the first blocking portion 360A that overlaps the step portion of the pixel electrode 191, thereby preventing the light from being viewed from the outside.

As described, the display device 10 according to the embodiment may include the anti-reflection portion 3000 that includes the light blocking layer 520 and the color filters 530, thereby preventing deterioration of transmittance while preventing contrast deterioration, and prevents external light from being viewed due to reflection by the step portion of the pixel electrode 191 while easing discharging of internal gas that may be generated during a process for forming an insulating layer that contains an organic material, thereby improving display quality of the display device 10.

FIG. 15 and FIG. 16 illustrate the first pixel PXA, and the structures described in the FIG. 15 and FIG. 16 are equally applicable to the third pixel PXC.

Many features of the display device 10 according to the above-described embodiment are equally applicable to the display device 10 according to the present embodiment.

Figure 17:
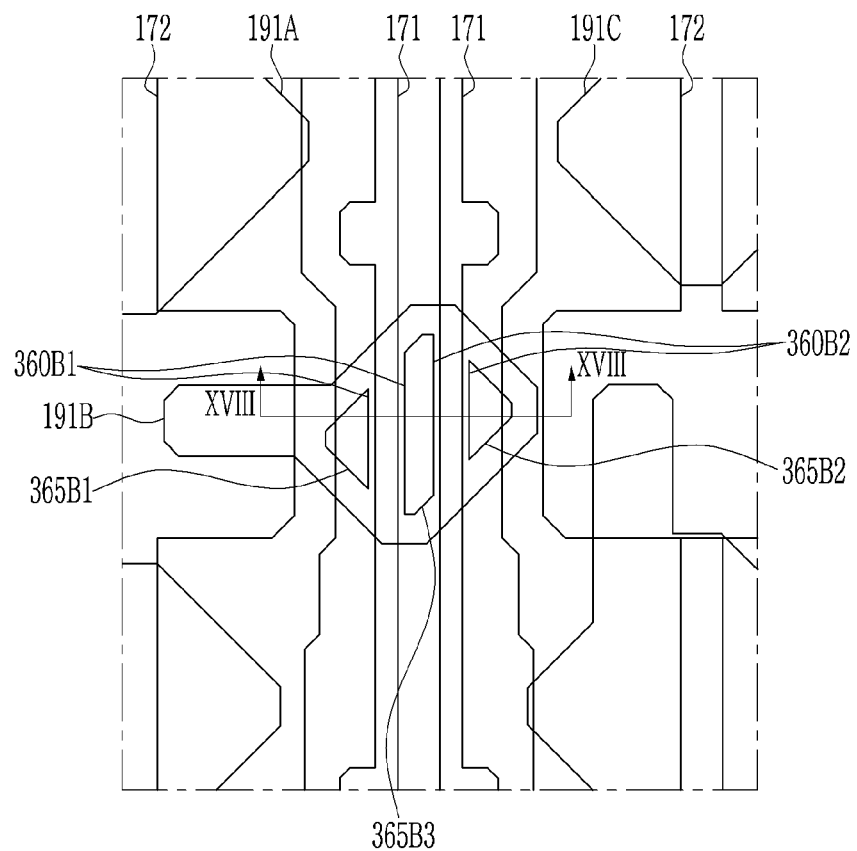
FIG. 17 is a top plan view of a display device according to an embodiment.

Next, some structure of the second pixel PXB of the display device 10 according to an embodiment will be described in more detail. FIG. 17 is a top plan view of the display device 10 according to an embodiment, and FIG. 18 is a cross-sectional view of FIG. 17, taken along the line XVIII-XVIII.

Figure 18:
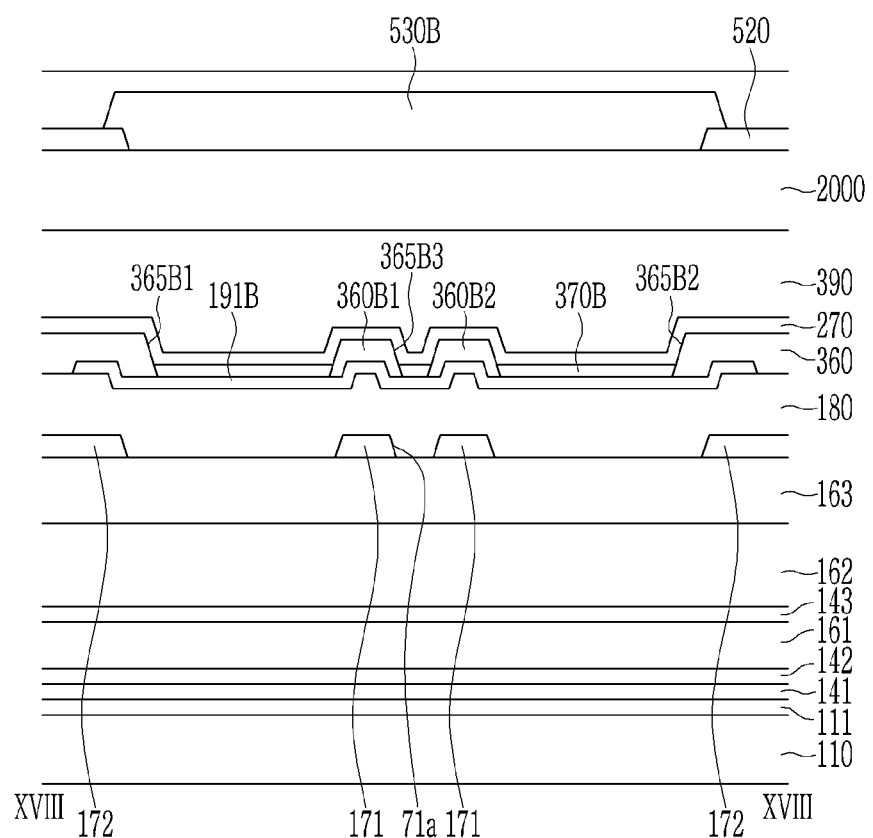
FIG. 18 is a cross-sectional view of FIG. 17, taken along the line XVIII-XVIII.

Similar to FIG. 15 and FIG. 16, the detailed structure of the display portion 1000 of the display device 10 is omitted in FIG. 17 and FIG. 18. FIG. 17 and FIG. 18 illustrate a configuration disposed on the third interlayer insulating layer 163 of the display portion 1000 omitting illustration of a configuration of the touch portion 2000. However, the interlayer structure and the pixel structure of the display portion 1000, and the structure of the touch portion 2000 of the display device 10 according to the above-described embodiment, are equally applicable to the present embodiment. In addition, detailed descriptions of the display device 10 and the same constituent elements according to the above-described embodiment will be omitted.

The buffer layer 111, the first gate insulating layer 141, the second gate insulating layer 142, the first interlayer insulating layer 161, the third gate insulating layer 143, the second interlayer insulating layer 162, and the third interlayer insulating layer 163 may be disposed on the substrate 110. As previously described, a plurality of transistors (e.g., T1 to T7) may be disposed below the third interlayer insulating layer 163.

A plurality of data lines 171 and a plurality of driving voltage lines 172 may be disposed on the third interlayer insulating layer 163.

Two adjacent data lines 171 may be disposed to be spaced apart from each other by the separation portion 71a.

The passivation layer 180 may be disposed on the plurality of data lines 171 and the plurality of driving voltage lines 172. The second pixel electrode 191B may be disposed on the passivation layer 180, and the pixel defining layer 360 may be disposed on the second pixel electrode 191B and the passivation layer 180.

The pixel defining layer 360 may include the second blocking portion 360B1 and the third blocking portion 360B2. The pixel defining layer 360, the second blocking portion 360B1, and the third blocking portion 360B2 may define the second pixel opening 365B. The second pixel opening 365B may include the third sub-pixel opening 365B1, the fourth sub-pixel opening 365B2, and the fifth sub-pixel opening 365B3. The fifth sub-pixel opening 365B3 may be disposed between the third sub-pixel opening 365B1 and the fourth sub-pixel opening 365B2, and the fifth sub-pixel opening 365B3 may be smaller than the third sub-pixel opening 365B1 and the fourth sub-pixel opening 365B2 in size.

The second blocking portion 360B1 may be disposed between the third sub-pixel opening 365B1 and the fifth sub-pixel opening 365B3, and the third blocking portion 360B2 may be disposed between the fourth sub-pixel opening 365B2 and the fifth sub-pixel opening 365B3.

The second light emitting element layer 370B may be disposed in the second pixel opening 365B, and the common electrode 270 may be disposed on the pixel defining layer 360 and the second light emitting element layer 370B. The encapsulation layer 390 may be disposed on the common electrode 270.

The touch portion 2000 may be disposed on the encapsulation layer 390. A detailed configuration of the touch portion 2000 is omitted.

The anti-reflection portion 3000 that includes the light blocking layer 520 and the second color filter 530B may be disposed on the touch portion 2000.

Two adjacent data lines 171 may be separated by the separation portion 71a, and the separation portion 71a may serve as a passage through which internal gas that may be generated in a process for forming an insulating layer may be discharged to the outside.

In the second pixel PXB, a step may be formed in the second pixel electrode 191B due to the separation portion 71a of the two adjacent data lines 171 that is disposed below the second pixel electrode 191B.

However, in the display device 10 according to the present embodiment, the pixel defining layer 360 may include the second blocking portion 360B1 and the third blocking portion 360B2 that respectively disposed to overlap opposite edges of each of the two adjacent data lines 171 including the separation portion 71a.

Thus, although the pixel electrode 191 may have a step portion due to the step formed due to the data lines 171 disposed below the passivation layer 180, externally incident light can be prevented from being reflected by the step portion of the pixel electrode 191 and passing through the second color filter 530B by the second blocking portion 360B1 and the third blocking portion 360B2 that overlap the step portion of the pixel electrode 191, thereby preventing the light from being viewed from the outside.

As described, the display device 10 according to the embodiment may include the anti-reflection portion 3000 that includes the light blocking layer 520 and the color filters 530, thereby preventing deterioration of transmittance while preventing contrast deterioration, and prevents external light from being viewed due to reflection by the step portion of the pixel electrode 191 while easing discharging of internal gas that may be generated during a process for forming an insulating layer that contains an organic material, thereby improving display quality of the display device 10.

Many features of the display device 10 according to the above-described embodiment are equally applicable to the display device 10 according to the present embodiment.

Figure 19:
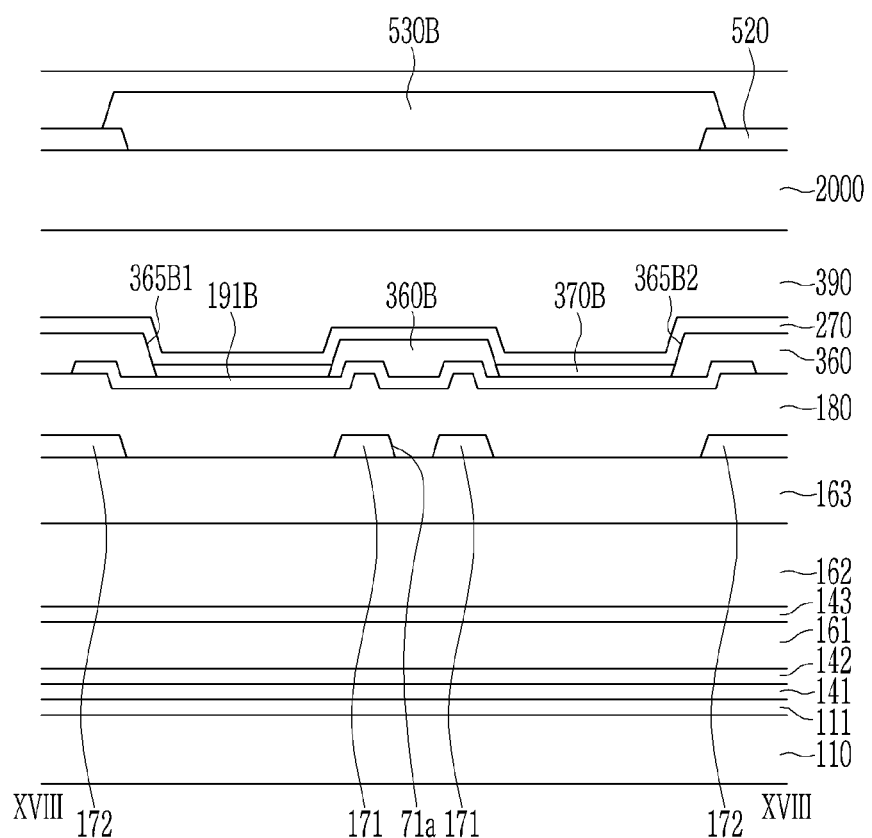
FIG. 19 is a cross-sectional view of a display device according to another embodiment.

Next, some structure of the second pixel PXB of the display device 10 according to another embodiment will be described in more detail. FIG. 19 is a cross-sectional view of the display device 10 according to another embodiment, taken along the line XVIII-XVIII of FIG. 17.

Similar to FIG. 17 and FIG. 18, the detailed structure of the display portion 1000 of the display device 10 is omitted in FIG. 19. FIG. 19 illustrates a configuration disposed on the third interlayer insulating layer 163 of the display portion 1000 omitting illustration of a configuration of the touch portion 2000. However, the interlayer structure and the pixel structure of the display portion 1000, and the structure of the touch portion 2000 of the display device 10 according to the above-described embodiment, are equally applicable to the present embodiment.

The display device 10 according to the embodiment of FIG. 19 is similar to the display device 10 according to the embodiment shown in FIG. 18. Detailed descriptions of the display device 10 and the same constituent elements according to the above-described embodiment will be omitted.

The buffer layer 111, the first gate insulating layer 141, the second gate insulating layer 142, the first interlayer insulating layer 161, the third gate insulating layer 143, the second interlayer insulating layer 162, and the third interlayer insulating layer 163 may be disposed on the substrate 110. As previously described, a plurality of transistors (e.g., T1 to T7) may be disposed below the third interlayer insulating layer 163.

A plurality of data lines 171 and a plurality of driving voltage lines 172 may be disposed on the third interlayer insulating layer 163.

Two adjacent data lines 171 may be disposed to be spaced apart from each other by the separation portion 71a.

The passivation layer 180 may be disposed on the plurality of data lines 171 and the plurality of driving voltage lines 172. The second pixel electrode 191B may be disposed on the passivation layer 180, and the pixel defining layer 360 may be disposed on the second pixel electrode 191B and the passivation layer 180.

The pixel defining layer 360 may include a fifth blocking portion 360B. The fifth blocking portion 360B may have a shape formed by combining the second blocking portion 360B1 and the third blocking portion 360B2 shown in FIG. 18.

The pixel defining layer 360 and the fifth blocking portion 360B may define the second pixel opening 365B. The second pixel opening 365B may include the third sub-pixel opening 365B1 and the fourth sub-pixel opening 365B2. Unlike the embodiment shown in FIG. 18, the fifth sub-pixel opening 365B3 is omitted.

The fifth blocking portion 360B may be disposed between the third sub-pixel opening 365B1 and the fourth sub-pixel opening 365B2.

The second light emitting element layer 370B may be disposed in the second pixel opening 365B, and the common electrode 270 may be disposed on the pixel defining layer 360 and the second light emitting element layer 370B. The encapsulation layer 390 may be disposed on the common electrode 270.

The touch portion 2000 may be disposed on the encapsulation layer 390. A detailed configuration of the touch portion 2000 is omitted.

The anti-reflection portion 3000 that includes the light blocking layer 520 and the second color filter 530B may be disposed on the touch portion 2000.

Two adjacent data lines 171 may be separated by the separation portion 71a, and the separation portion 71a may serve as a passage through which internal gas that may be generated in a process for forming an insulating layer, may be discharged to the outside.

In the second pixel PXB, a step may be formed in the second pixel electrode 191B due to the separation portion 71a of the two adjacent data lines 171 that is disposed below the second pixel electrode 191B.

However, in the display device 10 according to the present embodiment, the pixel defining layer 360 may include the fifth blocking portion 360B that overlaps the two adjacent data lines 171 including the separation portion 71a.

Thus, although the pixel electrode 191 may have a step portion due to the step formed due to the data lines 171 disposed below the passivation layer 180, externally incident light can be prevented from being reflected by the step portion of the pixel electrode 191 and passing through the second color filter 530B by the fifth blocking portion 360B that overlaps the step portion of the pixel electrode 191, thereby preventing the light from being viewed from the outside.

As described, the display device 10 according to the embodiment may include the anti-reflection portion 3000 that includes the light blocking layer 520 and the color filters 530, thereby preventing deterioration of transmittance while preventing contrast deterioration, and prevents external light from being viewed due to reflection by the step portion of the pixel electrode 191 while easing discharging of internal gas that may be generated during a process for forming an insulating layer that contains an organic material, thereby improving display quality of the display device 10.

Many features of the display device 10 according to the above-described embodiment are equally applicable to the display device 10 according to the present embodiment.

Figure 20:
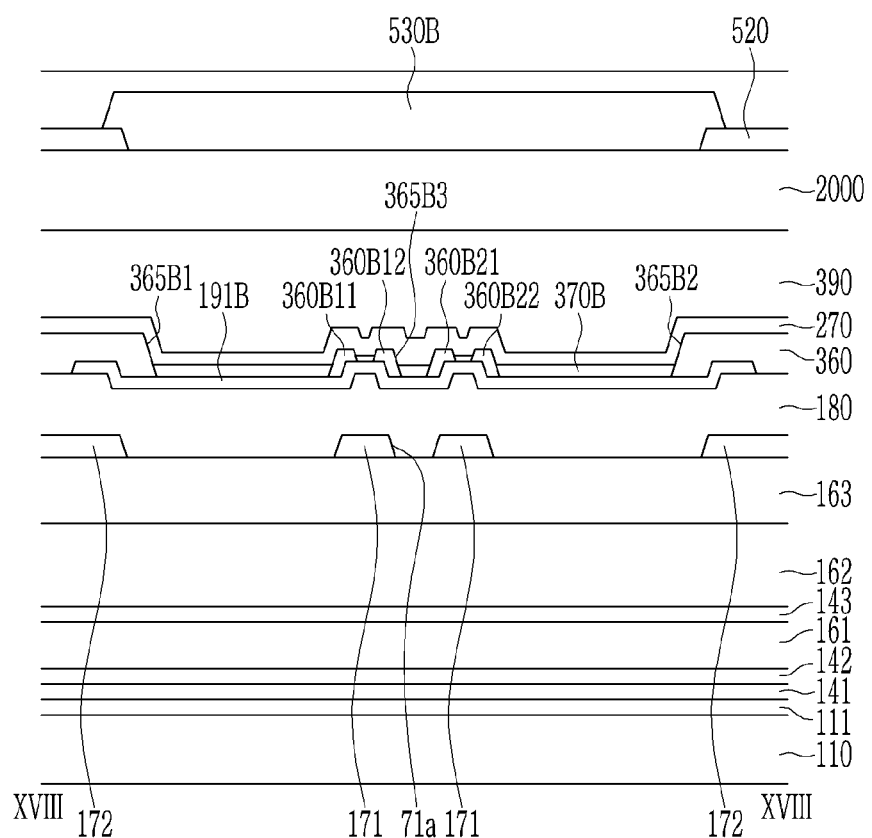
FIG. 20 is a cross-sectional view of a display device according to yet another embodiment.

Next, some structure of the second pixel PXB of the display device 10 according to yet another embodiment will be described in more detail. FIG. 20 is a cross-sectional view of the display device 10 according to yet another embodiment, taken along the line XVIII-XVIII of FIG. 17.

Similar to FIG. 17 and FIG. 18, the detailed structure of the display portion 1000 of the display device 10 is omitted in FIG. 20. FIG. 20 illustrates a configuration disposed on the third interlayer insulating layer 163 of the display portion 1000 omitting a configuration of the touch portion 2000. However, the interlayer structure and the pixel structure of the display portion 1000, and the structure of the touch portion 2000 of the display device 10 according to the above-described embodiment, are equally applicable to the present embodiment.

The display device 10 according to the embodiment of FIG. 20 is similar to the display device 10 according to the embodiment shown in FIG. 18. Detailed descriptions of the display device 10 and the same constituent elements according to the above-described embodiment will be omitted.

The buffer layer 111, the first gate insulating layer 141, the second gate insulating layer 142, the first interlayer insulating layer 161, the third gate insulating layer 143, the second interlayer insulating layer 162, and the third interlayer insulating layer 163 may be disposed on the substrate 110. As previously described, a plurality of transistors (e.g., T1 to T7) may be disposed below the third interlayer insulating layer 163.

A plurality of data lines 171 and a plurality of driving voltage lines 172 may be disposed on the third interlayer insulating layer 163.

Two adjacent data lines 171 may be disposed to be spaced apart from each other by the separation portion 71a.

The passivation layer 180 may be disposed on the plurality of data lines 171 and the plurality of driving voltage lines 172. The second pixel electrode 191B may be disposed on the passivation layer 180, and the pixel defining layer 360 may be disposed on the second pixel electrode 191B and the passivation layer 180.

The pixel defining layer 360 may include a first sub-blocking portion 360B11, a second sub-blocking portion 360B12, a third sub-blocking portion 360B21, and a fourth sub-blocking portion 360B22. The pixel defining layer 360, the first sub-blocking portion 360B11, the second sub-blocking portion 360B12, the third sub-blocking portion 360B21, and the fourth sub-blocking portion 360B22 may define the second pixel opening 365B. The second pixel opening 365B may include the third sub-pixel opening 365B1, the fourth sub-pixel opening 365B2, and the fifth sub-pixel opening 365B3. The fifth sub-pixel opening 365B3 may be disposed between the third sub-pixel opening 365B1 and the fourth sub-pixel opening 365B2, and the fifth sub-pixel opening 365B3 may be smaller than the third sub-pixel opening 365B1 and the fourth sub-pixel opening 365B2 in size.

The first sub-blocking portion 360B11 and the second sub-blocking portion 360B12 may be disposed between the third sub-pixel opening 365B1 and the fifth sub-pixel opening 365B3, and the third sub-blocking portion 360B21 and the fourth sub-blocking portion 360B22 may be disposed between the fourth sub-pixel opening 365B2 and the fifth sub-pixel opening 365B3.

The first sub-blocking portion 360B11 and the second sub-blocking portion 360B12 are similar to the second blocking portion 360B1 according to the embodiment of FIG. 1, except that the first sub-blocking portion 360B11 and the second sub-blocking portion 360B12 are disposed to overlap opposite edges of the data line 171. Similarly, the third sub-blocking portion 360B21 and the fourth sub-blocking portion 360B22 are similar to the third blocking portion 360B2 according to the embodiment of FIG. 18, except that the third sub-blocking portion 360B21 and the fourth sub-blocking portion 360B22 are disposed to overlap the opposite edges of the data line 171.

The second light emitting element layer 370B may be disposed in the second pixel opening 365B, and the common electrode 270 may be disposed on the pixel defining layer 360 and the second light emitting element layer 370B. The encapsulation layer 390 may be disposed on the common electrode 270.

The touch portion 2000 may be disposed on the encapsulation layer 390. A detailed configuration of the touch portion 2000 is omitted.

The anti-reflection portion 3000 that includes the light blocking layer 520 and the second color filter 530B may be disposed on the touch portion 2000.

Two adjacent data lines 171 may be separated by the separation portion 71a, and the separation portion 71a may serve as a passage through which internal gas that may be generated in a process for forming an insulating layer, may be discharged to the outside.

In the second pixel PXB, a step may be formed in the second pixel electrode 191B due to the separation portion 71a of the two adjacent data lines 171 that is disposed below the second pixel electrode 191B.

However, in the display device 10 according to the embodiment, the pixel defining layer 360 may include the first sub-blocking portion 360B11 and the second sub-blocking portion 360B12, and the third sub-blocking portion 360B21 and the fourth sub-blocking portion 360B22 that are respectively disposed to overlap opposite edges of each of the two adjacent data lines 171 that include the separation portion 71a.

Thus, although the pixel electrode 191 may have a step portion due to the step formed due to the data lines 171 disposed below the passivation layer 180, externally incident light can be prevented from being reflected by the step portion of the pixel electrode 191 and passing through the second color filter 530B by the first sub-blocking portion 360B11 and the second sub-blocking portion 360B12, and the third sub-blocking portion 360B21 and the fourth sub-blocking portion 360B22 that overlap the step portion of the pixel electrode 191, thereby preventing the light from being viewed from the outside.

In the display device 10 according to the embodiment of FIG. 20, since the first sub-blocking portion 360B11 and the second sub-blocking portion 360B12, and the third sub-blocking portion 360B21 and the fourth sub-blocking portion 360B22 overlap side surfaces of the step portion, external light can be prevented from being reflected and viewed in the step portion of the pixel electrode 191 while increasing an area of the second light emitting element layer 370B.

As described, the display device 10 according to the embodiment may include the anti-reflection portion 3000 that includes the light blocking layer 520 and the color filters 530, thereby preventing deterioration of transmittance while preventing contrast deterioration, and prevents external light from being viewed due to reflection by the step portion of the pixel electrode 191 while easing discharging of internal gas that may be generated during a process for forming an insulating layer that contains an organic material, thereby improving display quality of the display device 10.

Many features of the display device 10 according to the above-described embodiment are equally applicable to the display device 10 according to the present embodiment.

While the present disclosure has been described in connection with some embodiments, it is to be understood that the present disclosure is not limited to the disclosed embodiments. On the contrary, it is intended to cover various modifications and equivalent arrangements included within the spirit and scope of the present disclosure including the appended claims.

What is claimed is:

1. A display device comprising:
   a substrate;
   a plurality of transistors disposed on the substrate;
   an insulating layer disposed on the plurality of transistors;
   a data line and a driving voltage line disposed on the insulating layer;
   a pixel electrode disposed on the data line or the driving voltage line, the pixel electrode comprising a first pixel electrode and a second pixel electrode;
   a pixel defining layer disposed on the pixel electrode and including a pixel opening that overlaps the pixel electrode;
   a light emitting element layer disposed in the pixel opening; and
   a common electrode disposed on the light emitting element layer,
   wherein the pixel opening comprises a first sub-pixel opening and a second sub-pixel opening,
   wherein a first blocking portion is disposed between the first sub-pixel opening and the second sub-pixel opening, and overlaps a step portion of the first pixel electrode,
   wherein the light emitting element layer comprises a first light emitting element layer and a second light emitting element layer that are discretely disposed in the first sub-pixel opening and the second sub-pixel opening, and
   wherein the first sub-pixel opening and the second sub-pixel opening are disposed on the first pixel electrode.

2. The display device of claim 1, wherein the first blocking portion overlaps at least one of the data line and the driving voltage line.

3. The display device of claim 2, wherein the driving voltage line comprises two adjacent expansion portions and an opening that is disposed between the two expansion portions, and the first blocking portion overlaps the opening of the driving voltage line.

4. The display device of claim 2, wherein the data line comprises two adjacent data lines that overlap the pixel electrode, and the first blocking portion overlaps the two adjacent data lines.

5. The display device of claim 4, wherein the first blocking portion comprises a second blocking portion and a third blocking portion that respectively overlap the two adjacent data lines.

6. The display device of claim 5, wherein:
   the second blocking portion comprises a first sub-blocking portion and a second sub-blocking portion that overlap a first edge of a first data line of the two adjacent data lines, and
   the third blocking portion comprises a third sub-blocking portion and a fourth sub-blocking portion that overlap a second edge of a second data line of the two adjacent data lines.

7. The display device of claim 4, wherein the two adjacent data lines are separated by a separation portion, and the first blocking portion overlaps the separation portion and the two adjacent data lines.

8. The display device of claim 1, further comprising an anti-reflection portion disposed on the substrate,
   wherein the anti-reflection portion comprises a light blocking layer that overlaps the pixel defining layer and a color filter layer that overlaps the light emitting element layer.

9. The display device of claim 8, wherein the first blocking portion overlaps the color filter layer.

10. The display device of claim 9, further comprising a touch portion disposed between the light emitting element layer and the anti-reflection portion.

11. A display device comprising:
    a data line and a driving voltage line disposed on a substrate;
    a pixel electrode disposed on the substrate and comprising a first pixel electrode, a second pixel electrode, and a third pixel electrode;

a pixel defining layer disposed on the substrate and including a first pixel opening that overlaps the first pixel electrode, a second pixel opening that overlaps the second pixel electrode, and a third pixel opening that overlaps the third pixel electrode, wherein the pixel defining layer further comprises a blocking portion that overlaps the first pixel electrode;

a light emitting element layer comprising a first light emitting element layer that is disposed in the first pixel opening and displays a first color, a second light emitting element layer that is disposed in the second pixel opening and displays a second color, and a third light emitting element layer that is disposed in the third pixel opening and displays a third color; and a common electrode disposed on the light emitting element layer and the blocking portion, wherein the first pixel opening comprises a first sub-pixel opening and a second sub-pixel opening, wherein the first light emitting element layer has a plurality portions that are discretely disposed in each of the first sub-pixel opening and the second sub-pixel opening, wherein the blocking portion is disposed between the first sub-pixel opening and the second sub-pixel opening, and the first sub-pixel opening and the second sub-pixel opening are disposed on the first pixel electrode, and wherein the blocking portion overlaps a step portion of the first pixel electrode.

12. The display device of claim 11, wherein the blocking portion overlaps the driving voltage line.

13. The display device of claim 12, wherein the driving voltage line comprises two adjacent expansion portions and an opening that is disposed between the two expansion portions, and the blocking portion overlaps the opening of the driving voltage line.

14. The display device of claim 11, further comprising an anti-reflection portion disposed on the substrate, wherein the anti-reflection portion comprises a light blocking portion that overlaps the pixel defining layer, and a color filter layer that overlaps the light emitting element layer, and wherein the light blocking portion of the anti-reflection portion overlaps the color filter layer.

15. The display device of claim 11, wherein:

the second pixel opening comprises a third sub-pixel opening, a fourth sub-pixel opening, and a fifth sub-pixel opening, the pixel defining layer further comprises a first blocking portion and a second blocking portion that overlap the second pixel electrode, the first blocking portion is disposed between the third sub-pixel opening and the fifth sub-pixel opening, the second blocking portion is disposed between the fourth sub-pixel opening and the fifth sub-pixel opening, and at least one of the first blocking portion and the second blocking portion overlaps a step portion of the second pixel electrode.

16. The display device of claim 15, wherein:

the data line comprises two adjacent data lines that overlap the pixel electrode, and the first blocking portion and the second blocking portion respectively overlap the two adjacent data lines.

17. The display device of claim 16, wherein the first blocking portion comprises:

a first sub-blocking portion and a second sub-blocking portion that overlap a first edge of a first data line of the two adjacent data lines, and a third sub-blocking portion and a fourth sub-blocking portion that overlap a second edge of a second data line of the two adjacent data lines.

18. The display device of claim 16, further comprising an anti-reflection portion disposed on the substrate, wherein the anti-reflection portion comprises a light blocking portion that overlaps the pixel defining layer, a first color filter layer that overlaps the first light emitting element layer, a second color filter layer that overlaps the second light emitting element layer, and a third color filter layer that overlaps the third light emitting element layer, wherein the light blocking portion of the anti-reflection portion overlaps the first color filter, and wherein at least one of the first blocking portion and the second blocking portion overlaps the second color filter layer.

19. The display device of claim 11, wherein:

the data line comprises two adjacent data lines that overlap the second pixel electrode, and the blocking portion overlaps the two adjacent data lines.

20. The display device of claim 19, wherein the two adjacent data lines are separated by a separation portion, and the blocking portion overlaps the separation portion and the two adjacent data lines.

* * * * *